US008841673B2

(12) United States Patent
Kanegae et al.

(10) Patent No.: US 8,841,673 B2
(45) Date of Patent: *Sep. 23, 2014

(54) THIN-FILM TRANSISTOR DEVICE AND METHOD FOR MANUFACTURING THIN-FILM TRANSISTOR DEVICE

(71) Applicant: Panasonic Corporation, Osaka (JP)

(72) Inventors: Arinobu Kanegae, Osaka (JP);
Takahiro Kawashima, Osaka (JP);
Hiroshi Hayashi, Kyoto (JP);
Genshirou Kawachi, Chiba (JP)

(73) Assignees: Panasonic Corporation, Osaka (JP);
Panasonic Liquid Crystal Display Co., Ltd., Hyogo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/742,481

(22) Filed: Jan. 16, 2013

(65) Prior Publication Data
US 2013/0126869 A1 May 23, 2013

Related U.S. Application Data

(63) Continuation of application No. PCT/JP2012/000765, filed on Feb. 6, 2012.

(30) Foreign Application Priority Data

Jun. 30, 2011 (JP) ................. 2011-145870

(51) Int. Cl.
H01L 29/04 (2006.01)
H01L 29/10 (2006.01)
H01L 29/18 (2006.01)

(52) U.S. Cl.
USPC ............... 257/63; 257/57; 257/88; 438/235; 438/312; 438/150

(58) Field of Classification Search
USPC ................. 257/57, 183, 63, 88; 438/235, 312
See application file for complete search history.

(56) References Cited

U.S. PATENT DOCUMENTS 6,750,480 B2 * 6/2004 Welser et al. ................. 257/183
6,847,060 B2 * 1/2005 Welser et al. ................. 257/197
(Continued)

FOREIGN PATENT DOCUMENTS

JP 10-270701 10/1998
JP 2001-217424 8/2001
(Continued)

OTHER PUBLICATIONS

U.S. Appl. No. 13/737,275 to Arinobu Kanegae et al., filed Jan. 9, 2013.
(Continued)

Primary Examiner — Nicholas Tobergte
(74) Attorney, Agent, or Firm — Greenblum & Bernstein, P.L.C.

(57) ABSTRACT

A thin-film transistor device includes: a gate electrode above a substrate; a gate insulating film on the gate electrode; a crystalline silicon thin film above the gate insulating film; a first semiconductor film above the crystalline silicon thin film; a pair of second semiconductor films above the first semiconductor film; a source electrode over one of the second semiconductor films; and a drain electrode over an other one of the second semiconductor films. The first semiconductor film is provided on the crystalline silicon thin film. A relationship $E_{CP} < E_{C1}$ is satisfied where $E_{CP}$ and $E_{C1}$ denote energy levels at lower ends of conduction bands of the crystalline silicon thin film and the first semiconductor film, respectively.

23 Claims, 11 Drawing Sheets

(56) References Cited

U.S. PATENT DOCUMENTS

| | | | |
|---|---|---|---|
| 7,115,466 B2 * | 10/2006 | Welser et al. | 438/235 |
| 7,186,624 B2 * | 3/2007 | Welser et al. | 438/312 |
| 7,345,327 B2 * | 3/2008 | Welser et al. | 257/200 |
| 8,253,138 B2 | 8/2012 | Yamazaki et al. | |
| 8,283,667 B2 * | 10/2012 | Takahashi et al. | 257/57 |
| 2009/0114917 A1 | 5/2009 | Yamazaki et al. | |
| 2010/0059749 A1 * | 3/2010 | Takahashi et al. | 257/57 |
| 2012/0094403 A1 | 4/2012 | Nagai et al. | |
| 2013/0001559 A1 | 1/2013 | Kishida et al. | |

FOREIGN PATENT DOCUMENTS

| | | |
|---|---|---|
| JP | 2008-124392 | 5/2008 |
| JP | 2009-135482 | 6/2009 |
| JP | 2010-087491 | 4/2010 |
| JP | 2010-251701 | 11/2010 |

OTHER PUBLICATIONS

International Search Report in International Application No. PCT/JP2012/000765, dated Mar. 13, 2012.

* cited by examiner (electron affinity of a-Si is 3.7 eV)

(electron affinity of a-Si is 4.0 eV)

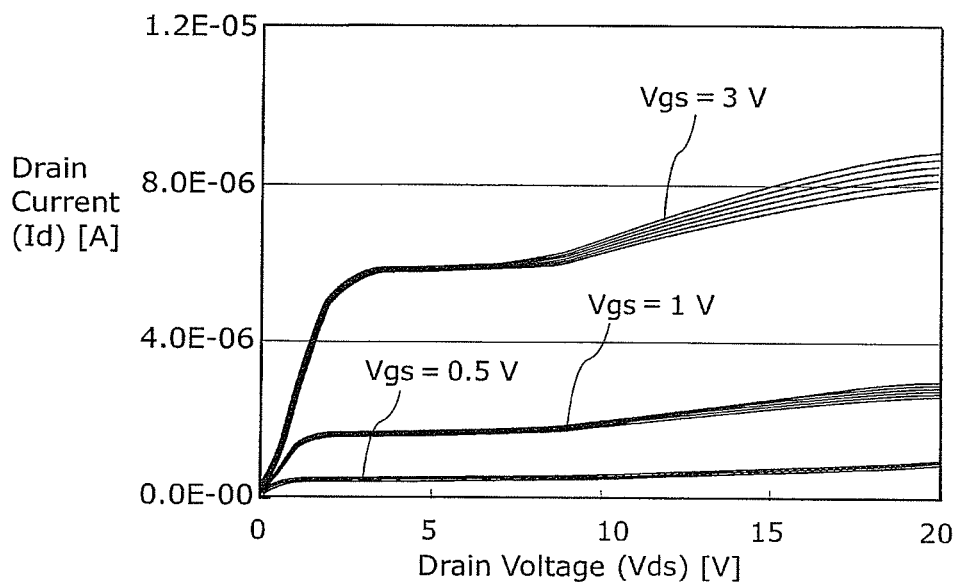
FIG. 7A
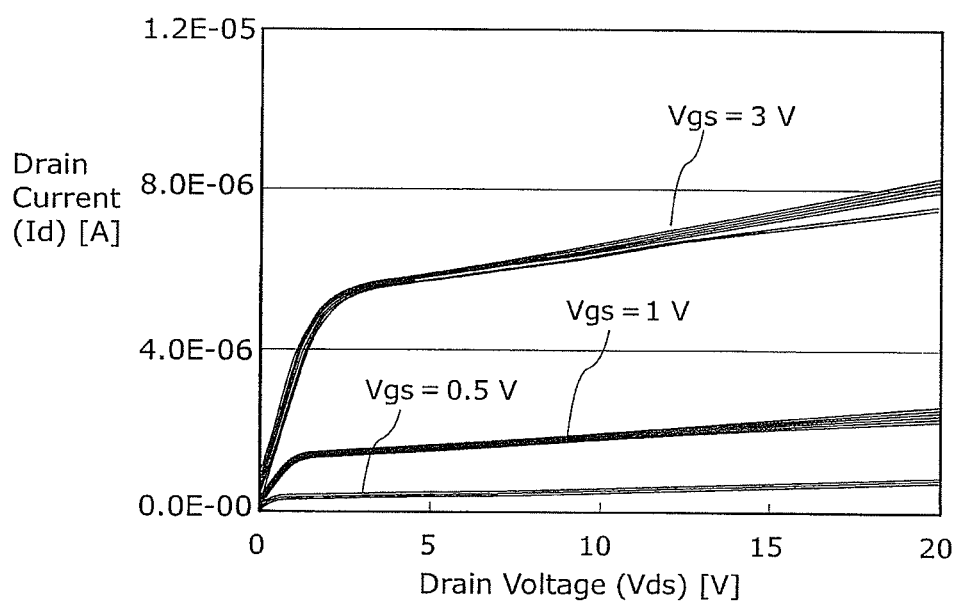
FIG. 7B
FIG. 8A

THIN-FILM TRANSISTOR DEVICE AND METHOD FOR MANUFACTURING THIN-FILM TRANSISTOR DEVICE

CROSS REFERENCE TO RELATED APPLICATIONS

This is a continuation application of PCT Patent Application No. PCT/JP2012/000765 filed on Feb. 6, 2012, designating the United States of America, which is based on and claims priority of Japanese Patent Application No. 2011-145870 filed on Jun. 30, 2011. The entire disclosures of the above-identified applications, including the specifications, drawings and claims are incorporated herein by reference in their entirety.

FIELD

One or more exemplary embodiments disclosed herein relate generally to thin-film transistor devices and methods for manufacturing the thin-film transistor devices.

BACKGROUND

In an active-matrix display device such as a liquid crystal display, a thin-film transistor device referred to as a thin-film transistor (TFT) has been used. In the display device, the TFT is used as a switching device for selecting a pixel or a driving transistor for driving the pixel.

In recent years, organic EL displays using electroluminescence (EL) of an organic material have been attracting attention as a type of next-generation flat panel display replacing liquid crystal displays.

Unlike the voltage-driven liquid crystal display, the organic EL display is a current-driven display device. Accordingly, there is an urgent need for development of a thin-film transistor device having excellent on/off-characteristics as a driving circuit for the active-matrix display device. A TFT has a structure in which a gate electrode, a semiconductor layer (channel layer), a source electrode, and a drain electrode are formed on a substrate. The channel layer is typically a silicon thin film.

Moreover, display devices are demanded to increase a screen size and reduce a cost. In general, because of easy cost reduction, bottom-gate TFTs are used. A bottom-gate TFT has a gate electrode formed closer to a substrate more than a channel layer is.

The bottom-gate TFTs are classified into two major categories: channel-etching TFTs in which a channel layer is etched, and channel-stopper TFTs in which a channel layer is prevented from being etched.

In comparison to the channel-stopper TFTs, the channel-etching TFTs can decrease steps of photolithography, thereby reducing a manufacturing cost.

For example, Patent Literature 1 discloses a channel-etching thin-film transistor capable of increasing On-current and suppressing Off-current. The thin-film transistor disclosed in Patent Literature 1 includes: a gate electrode on a substrate; a gate insulating film on the gate electrode; an active layer composed of a polycrystalline silicon film on the gate insulating film; contact layers each provided between the active layer and a corresponding one of the source electrode and the drain electrode; an electric field limiting layer composed of an amorphous silicon film provided between the contact layers and the active layer.

CITATION LIST

Patent Literature

Patent Literature 1: Japanese Unexamined Patent Application Publication No. 2001-217424

SUMMARY

Technical Problem

However, the structure of the conventional channel-stopper TFT has a problem that, in drain current/drain-to-source voltage (Id–Vds) characteristics, kink phenomenon by which a drain current (Id) is rapidly increased occurs. In particular, this kink phenomenon often occurs when the drain-to-source voltage (Vds) is high.

In order to address the problem, in particular, organic EL display devices or analog circuits which use saturated regions of TFTs cannot use the conventional TFTs disclosed in Patent Literature 1.

As explained above, the conventional TFTs have a problem of TFT characteristic deterioration caused by kink phenomenon.

In order to address the above problems, one non-limiting and exemplary embodiment provides a thin-film transistor device having reliable TFT characteristics with suppressed kink phenomenon and a method for manufacturing the thin-film transistor device.

Solution to Problem

In order to achieve the above object, in one general aspect, the techniques disclosed here feature a thin-film transistor device comprising: a gate electrode above a substrate; a gate insulating film above the gate electrode; a crystalline silicon thin film above the gate insulating film; a first semiconductor film above the crystalline silicon thin film; a pair of second semiconductor films above the first semiconductor film; a source electrode over one of the second semiconductor films; and a drain electrode over an other one of the second semiconductor films, wherein the first semiconductor film is provided on the crystalline silicon thin film, $E_{CP} < E_{C1}$ where $E_{CP}$ denotes an energy level at a lower end of a conduction band of the crystalline silicon thin film and $E_{C1}$ denotes an energy level at a lower end of a conduction band of the first semiconductor film, and the energy level $E_{CP}$ at the lower end of the conduction band of the crystalline silicon thin film and the energy level $E_{C1}$ at the lower end of the conduction band of the first semiconductor film are adjusted to suppress a spike at a junction between the crystalline silicon thin film and the first semiconductor film.

These general and specific aspects may be implemented using a system, a method, an integrated circuit, a computer program, or a computer-readable recording medium such as a CD-ROM, or any combination of systems, methods, integrated circuits, computer programs, or computer-readable recording media.

Additional benefits and advantages of the disclosed embodiments will be apparent from the Specification and Drawings. The benefits and/or advantages may be individually obtained by the various embodiments and features of the Specification and Drawings, which need not all be provided in order to obtain one or more of such benefits and/or advantages.

Advantageous Effects

The thin-film transistor device and the method for manufacturing the thin-film transistor device can suppress kink phenomenon, thereby offering reliable TFT characteristics.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 7A is a graph plotting a relationship of a drain current (Id) to a drain voltage (Vds) in the thin-film transistor device corresponding to the comparative example.

FIG. 7B is a graph plotting a relationship of a drain current (Id) to a drain voltage (Vds) in the thin-film transistor device corresponding to the exemplary embodiment.

FIG. 8A is a cross-sectional view schematically illustrating a step of preparing a substrate in a method for manufacturing the thin-film transistor device according to the exemplary embodiment.

DESCRIPTION OF EMBODIMENT(S)

Figure 1:
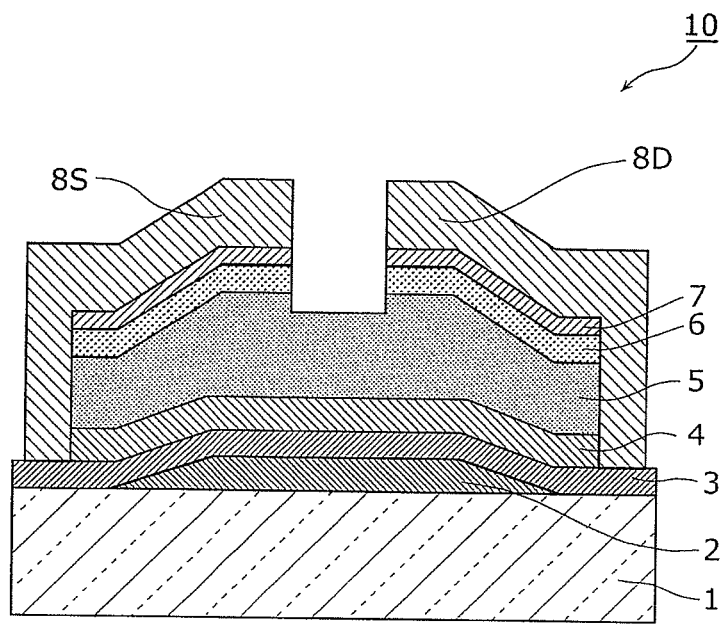
FIG. 1 is a cross-sectional view schematically illustrating a structure of a thin-film transistor device according to one exemplary embodiment.

According to an exemplary embodiment disclosed herein, a thin-film transistor device comprising: a gate electrode above a substrate; a gate insulating film above the gate electrode; a crystalline silicon thin film above the gate insulating film; a first semiconductor film above the crystalline silicon thin film; a pair of second semiconductor films above the first semiconductor film; a source electrode over one of the second semiconductor films; and a drain electrode over an other one of the second semiconductor films, wherein the first semiconductor film is provided on the crystalline silicon thin film, $E_{CP} < E_{C1}$ where $E_{CP}$ denotes an energy level at a lower end of a conduction band of the crystalline silicon thin film and $E_{C1}$ denotes an energy level at a lower end of a conduction band of the first semiconductor film, and the energy level $E_{CP}$ at the lower end of the conduction band of the crystalline silicon thin film and the energy level $E_{C1}$ at the lower end of the conduction band of the first semiconductor film are adjusted to suppress a spike at a junction between the crystalline silicon thin film and the first semiconductor film.

With this, these energy levels at the lower ends of the conduction bands at the junction between the crystalline silicon thin film and the first semiconductor film are continuous. As a result, occurrence of a spike at the junction can be suppressed to suppress occurrence of kink phenomenon.

For example, electron affinity of the first semiconductor film may be different from electron affinity of the second semiconductor films. In this case, it is desirable that the electron affinity of the first semiconductor film may be greater than the electron affinity of the second semiconductor films.

With this, these electron affinity are adjusted to easily satisfy $E_{CP} < E_{C1}$.

For example, the first semiconductor film and the pair of the second semiconductor films may be semiconductor films made mainly of silicon and have different band gaps. In this case, it is desirable that the band gap of the first semiconductor film may be closer to a band gap of the crystalline silicon thin film than the band gap of each of the second semiconductor films is.

With this, the adjustment of the band gaps easily satisfy $E_{CP} < E_{C1}$.

For example, the first semiconductor film and the pair of the second semiconductor films may be amorphous silicon films.

With this, the second semiconductor films can suppress Off-current to improve turn-Off characteristics.

For example, the first semiconductor film and the pair of the second semiconductor films may be semiconductor films made mainly of silicon and have different crystallization ratios. In this case, it is desirable that the crystallization ratio of the first semiconductor film may be greater than the crystallization ratio of the pair of the second semiconductor films.

With this, it is possible to set the energy levels at the lower ends of the conduction bands to be continuous at the junction between the crystalline silicon thin film and the first semiconductor film. As a result, occurrence of a spike can be suppressed at the junction.

It is desirable that the first semiconductor film is provided on the crystalline silicon thin film.

With this, the amorphous silicon film formed on and close to the surface of the crystalline silicon thin film takes over the crystallinity of the crystalline silicon thin film to be also crystallized. It is therefore possible to easily set the crystallization ratio of the first semiconductor film as the lower layer to be greater than the crystallization ratio of the second semiconductor films as the upper layer.

For example, the energy level $E_{CP}$ at the lower end of the conduction band of the crystalline silicon thin film and the energy level $E_{C1}$ at the lower end of the conduction band of the first semiconductor film may be adjusted to suppress a spike at a junction between the crystalline silicon thin film and the first semiconductor film. In this case, it is desirable that from the first semiconductor film to the crystalline silicon thin film, no barrier exists between the conduction band of the first semiconductor film and the conduction band of the crystalline silicon thin film.

With this, the thin-film transistor device can suppress kink phenomenon, thereby providing reliable TFT characteristics.

For example, the first semiconductor film may include one of carbon and germanium.

With this, by doping carbon into the first semiconductor film, it is possible to adjust the energy level at the lower end of the conduction band. If germanium is doped in the first semiconductor film, it is possible to adjust an energy level at an upper end of a valence band. As a result, $E_{CP} < E_{C1}$ can be easily satisfied.

For example, the first semiconductor film may have a concave shape under a region between the source electrode and the drain electrode.

With this, it is possible that the first semiconductor film has a concave shape between the source electrode and the drain electrode.

According to another exemplary embodiment disclosed herein, a method for manufacturing a thin-film transistor device, the method comprising: preparing a substrate; forming a gate electrode above the substrate; forming a gate insulating film above the gate electrode; forming a crystalline silicon thin film above the gate insulating film; forming a multi-layer film above the crystalline silicon thin film, the multi-layer film including a first semiconductor film, a second semiconductor film, and a contact layer; patterning the crystalline silicon thin film, the first semiconductor film, the second semiconductor film, and the contact layer to have a predetermined shape; and forming a source electrode and a drain electrode above the second semiconductor film, wherein in the forming of the multi-layer film, the first semiconductor film is provided on the crystalline silicon thin film, and $E_{CP} < E_{C1}$ where $E_{CP}$ denotes an energy level at a lower end of a conduction band of the crystalline silicon thin film and $E_{C1}$ denotes an energy level at a lower end of a conduction band of the first semiconductor film, and in the forming of the multi-layer film, the first semiconductor film and the second semiconductor film are formed by setting the energy level $E_{CP}$ at the lower end of the conduction band of the crystalline silicon thin film and the energy level $E_{C1}$ at the lower end of the conduction band of the first semiconductor film to suppress a spike at a junction between the crystalline silicon thin film and the first semiconductor film.

In this way, a semiconductor layer including the crystalline silicon thin film, the first semiconductor film, and the second semiconductor film can be formed to cause these energy levels at the lower ends of the conduction bands at the junction between the crystalline silicon thin film and the first semiconductor film to be continuous. As a result, occurrence of a spike at the junction can be suppressed to manufacture a thin-film transistor device with suppressed occurrence of kink phenomenon.

For example, in the forming of the multi-layer film, the first semiconductor film and the second semiconductor film may be formed by setting electron affinity of the first semiconductor film to be different from electron affinity of the second semiconductor film. In this case, it is desirable that in the forming of the multi-layer film, the first semiconductor film and the second semiconductor film are formed by setting the electron affinity of the first semiconductor film to be greater than the electron affinity of the second semiconductor film.

In this way, it is possible to form the semiconductor layer easily satisfying $E_{CP} < E_{C1}$.

For example, the first semiconductor film and the second semiconductor film may be semiconductor films made mainly of silicon, and in the forming of the multi-layer film, the first semiconductor film and the second semiconductor film may be formed to have different band gaps. In this case, it is desirable that in the forming of the multi-layer film, the first semiconductor film and the second semiconductor film may be formed by setting the band gap of the first semiconductor film to be closer to a band gap of the crystalline silicon thin film than the band gap of the second semiconductor film is.

In this way, it is possible to form the semiconductor layer easily satisfying $E_{CP} < E_{C1}$.

For example, in the forming of the multi-layer film, the first semiconductor film and the second semiconductor film may be amorphous silicon films.

In this way, it is possible to suppress Off-current to improve turn-Off characteristics, and to manufacture a thin-film transistor with suppressed kink phenomenon occurrence.

For example, the first semiconductor film and the second semiconductor film may be semiconductor films made mainly of silicon, and in the forming of the multi-layer film, the first semiconductor film and the second semiconductor film may be formed to have different crystallization ratios. In this case, it is desirable that in the forming of the multi-layer film, the first semiconductor film and the second semiconductor film may be formed by setting the crystallization ratio of the first semiconductor film to be greater than the crystallization ratio of the second semiconductor film.

In this way, it is possible to form the semiconductor layer in which the energy levels at the lower ends of the conduction bands at the junction between the crystalline silicon thin film and the first semiconductor film are continuous.

It is desirable that, in the forming of the multi-layer film, the first semiconductor film is formed on the crystalline silicon thin film.

In this way, crystallization is progressed for the amorphous silicon film formed on and close to the surface of the crystalline silicon thin film serving as an under-layer. It is easily possible to cause the crystallization ratio of the first semiconductor film as a lower layer to be greater than the crystallization ratio of the second semiconductor film as an upper layer.

For example, in the forming of the multi-layer film, the first semiconductor film may include one of carbon and germanium.

With this, by doping carbon into the first semiconductor film, it is possible to adjust the energy level at the lower end of the conduction band. If germanium is doped in the first semiconductor film, it is possible to adjust an energy level at an upper end of a valence band. In this way, it is possible to form the semiconductor layer easily satisfying $E_{CP} < E_{C1}$.

For example, in the forming of the multi-layer film, the first semiconductor film and the second semiconductor film may be formed continuously in a same vacuum apparatus.

In this way, it is possible to simultaneously form the first semiconductor film and the second semiconductor film which satisfy $E_{CP} < E_{C1}$. In particular, it is possible to continuously form the first semiconductor film and the second semiconductor film having different crystallization ratios.

For example, the method may further include removing a part of the contact layer and a part of an upper portion of the second semiconductor layer which are positioned between the source electrode and the drain electrode, after the forming of the source electrode and the drain electrode.

In this way, by removing the part of the upper portion of the first semiconductor film by etching, it is possible to form the second semiconductor film to have a concave shape under a region between the source electrode and the drain electrode.

According to still another exemplary embodiment disclosed herein, a thin-film transistor device comprising: a gate electrode above a substrate; a gate insulating film above the gate electrode; a crystalline silicon thin film above the gate insulating film; a first semiconductor film above the crystalline silicon thin film; a pair of second semiconductor films above the first semiconductor film; a source electrode over one of the second semiconductor films; and a drain electrode over an other one of the second semiconductor films, wherein $E_{CP} < E_{C1}$ where $E_{CP}$ denotes an energy level at a lower end of a conduction band of the crystalline silicon thin film and $E_{C1}$ denotes an energy level at a lower end of a conduction band of the first semiconductor film, the first semiconductor film and the second semiconductor films are semiconductor films made mainly of silicon, and a crystallization ratio of the first semiconductor film is greater than a crystallization ratio of the second semiconductor films.

Also in this way, a semiconductor layer including the crystalline silicon thin film, the first semiconductor film, and the second semiconductor films can be formed to cause these energy levels at the lower ends of the conduction bands at the junction between the crystalline silicon thin film and the first semiconductor film to be continuous. As a result, occurrence of a spike at the junction can be suppressed to manufacture a thin-film transistor device with suppressed occurrence of kink phenomenon.

These general and specific aspects may be implemented using a system, a method, an integrated circuit, a computer program, or a computer-readable recording medium such as a CD-ROM, or any combination of systems, methods, integrated circuits, computer programs, or computer-readable recording media.

Hereinafter, certain exemplary embodiments are described in greater detail with reference to the accompanying Drawings.

Each of the exemplary embodiments described below shows a general or specific example. The numerical values, shapes, materials, structural elements, the arrangement and connection of the structural elements, steps, the processing order of the steps etc. shown in the following exemplary embodiments are mere examples, and therefore do not limit the scope of the appended Claims and their equivalents. Therefore, among the structural elements in the following exemplary embodiments, structural elements not recited in any one of the independent claims are described as arbitrary structural elements.

Embodiment

The following shall describe a thin-film transistor device and a method for manufacturing the thin-film transistor device according to an embodiment. However, the present disclosure is defined based on the recitations in Claims. Accordingly, among components in the embodiment, the components not recited in Claims are not necessary for solving the problem, but composes a more preferable embodiment. Note that, the diagrams are schematic diagrams, and the illustration is not always strictly accurate.

(Structure of Thin-Film Transistor Device)

First, the structure of the thin-film transistor device 10 according to the present embodiment shall be described with reference to FIG. 1. FIG. 1 is a cross-sectional view schematically illustrating the structure of the thin-film transistor device according to the present embodiment.

As illustrated in FIG. 1, the thin-film transistor device 10 according to the present embodiment is a bottom-gate thin-film transistor device. The thin-film transistor device 10 includes: a substrate 1; and a gate electrode 2, a gate insulating film 3, a crystalline silicon thin film 4, a first semiconductor film 5, a pair of second semiconductor films 6, a pair of contact layers 7, and a pair of a source electrode 8S and a drain electrode 8D, all of which are sequentially formed above the substrate 1. The following shall describe the components of the thin-film transistor device 10 according to the present embodiment in detail.

The substrate 1 is a glass substrate made of, for example, a glass material such as silica glass, alkali-free glass, or highly heat-resistant glass. An undercoat layer composed of a silicon nitride ($SiN_x$) film, a silicon oxide ($SiO_y$) film, a silicon oxynitride ($SiO_yN_x$) film, or others may be formed on the substrate 1 in order to prevent impurity such as sodium and phosphorus in the glass substrate from entering the crystalline silicon thin film 4. In addition, the undercoat layer also functions as a layer for buffering the heat on the substrate 1 in a high-temperature thermal treatment process such as laser annealing. The thickness of the undercoat layer may be, for example, approximately 100 nm to 2000 nm.

The gate electrode 2 is patterned on the substrate 1 in a predetermined shape. The gate electrode 2 may have a single-layer structure or a multi-layer structure of that is made of a conductive material, an alloy including the material, or the like, and is made of, for example, molybdenum (Mo), aluminum (Al), copper (Cu), tungsten (W), titanium (Ti), chromium (Cr), and molybdenum-tungsten (MoW), for example. The thickness of the gate electrode 2 may be, for example, approximately 20 nm to 500 nm.

The gate insulating film 3 is provided on the gate electrode 2. In the present embodiment, the gate insulating film 3 is provided on/above the entire top surface of the substrate 1 to cover the gate electrode 2. The gate insulating film 3 may be, for example, a single-layer film of silicon oxide ($SiO_y$), silicon nitride ($SiN_x$), a silicon oxynitride ($SiO_yN_x$) film, aluminum oxide ($AlO_z$), or tantalum oxide ($TaO_w$), or a multi-layer film of at least two of these materials. The thickness of the gate insulating film 3 may be, for example, 50 nm to 300 nm.

In the present embodiment, the crystalline silicon thin film 4 is included as a semiconductor layer serving as a TFT channel layer. Accordingly, silicon oxide is desirably used for the gate insulating film 3. The reason for this is that it is desirable to have good interface state between the crystalline silicon thin film 4 and the gate insulating film 3 for maintaining reliable threshold voltage characteristics of the TFT, and silicon oxide is suitable for this purpose.

The crystalline silicon thin film 4 is a semiconductor layer provided on the gate insulating film 3, having a predetermined channel region in which movement of carriers are controlled by the voltage at the gate electrode 2.

The crystalline silicon thin film 4 according to the present embodiment is a crystalline silicon thin film having a crystalline structure, and is a microcrystalline silicon thin film or a polycrystalline silicon thin film. The crystalline silicon thin film 4 may be formed by crystallizing amorphous silicon having amorphous characteristics, for example. It is also possible that the crystalline silicon thin film 4 is a silicon thin film having a mixed crystalline structure of amorphous silicon and crystalline silicon. In this case, in order to produce reliable turn-On characteristics, at least the predetermined channel region of the crystalline silicon thin film 4 desirably has crystalline silicon more than amorphous silicon. The thickness of the crystalline silicon thin film 4 may be, for example, approximately 20 nm to 100 nm. The silicon crystal in the crystalline silicon thin film 4 desirably has a principal surface orientation of [100]. With the structure, the crystalline silicon thin film 4 has reliable crystallinity.

An average grain size of the crystalline silicon in the crystalline silicon thin film 4 is approximately 5 nm to 1000 nm. The crystalline silicon thin film 4 includes the above-described poly-crystal having an average grain size of at least 100 nm, or a so-called micro-crystal (µc) having an average grain size of at least 10 nm and smaller than 100 nm.

Like the crystalline silicon thin film 4 as being a semiconductor layer, a set of the first semiconductor film 5 and the pair of the second semiconductor films 6 is also a semiconductor layer, and provided above the crystalline silicon thin film 4. This semiconductor layer is a multi-layer film including a plurality of semiconductor films. In the present embodiment, the semiconductor layer includes two films: the first semiconductor film 5 and the pair of the second semiconductor films 6.

The first semiconductor film 5 is provided on the crystalline silicon thin film 4, being in contact with the top surface of the crystalline silicon thin film 4. The first semiconductor film 5 has a concave shape under the region between the source electrode 8S and the drain electrode 8D. The thickness of the first semiconductor film 5 desirably ranges between 10 nm and 100 nm.

The second semiconductor films 6 in the pair are separately provided on the first semiconductor film 5, and each of the second semiconductor films 6 is formed continuously on the first semiconductor film 5. The second semiconductor films 6 in the pair face each other with a predetermined distance. The thickness of each of the second semiconductor films 6 desirably ranges between 10 nm and 400 nm.

Here, when energy levels at lower ends of conduction bands of the crystalline silicon thin film 4 and the first semiconductor film 5 are represented as $E_{CP}$ and $E_{C1}$, respectively, the crystalline silicon thin film 4 and the first semiconductor film 5 satisfy a relationship $E_{CP} < E_{C1}$.

In the present embodiment, the first semiconductor film 5 and the pair of the second semiconductor films 6 have different electron affinity. In this case, it is desirable that the electron affinity of the first semiconductor film 5 is greater than the electron affinity of the second semiconductor films 6. The electron affinity of a semiconductor film refers to a difference between a vacuum level and an energy level at a lower end of a conduction band. This means that the electron affinity can be used to adjust the energy level at the lower end of the conduction band of the semiconductor film.

In the present embodiment, the first semiconductor film 5 and the pair of the second semiconductor films 6 have different crystallization ratios. In this case, it is desirable that the crystallization ratio of the first semiconductor film 5 is greater than the crystallization ratio of the pair of the second semiconductor films 6. The above setting of the crystallization ratios can easily result in the relationship of $E_{CP} < E_{C1}$. The first semiconductor film 5 according to the present embodiment includes crystalline silicon grains each having a crystalline grain size ranging from 5 nm to 1000 nm. The crystallization ratio in a thickness direction of the first semiconductor film 5 is gradually increased as being closer to the crystalline silicon thin film 4. In the present embodiment, the crystalline grain size of the crystalline silicon grains in the first semiconductor film 5 is gradually increased as being closer to the crystalline silicon thin film. On the other hand, the pair of the second to semiconductor films 6 according to the present embodiment is not crystallized and therefore has a crystallization ratio of zero.

The crystallization ratio refers to a degree of crystallizing the silicon semiconductor film structure if the semiconductor film is made mainly of silicon. For example, the crystallization ratio may be expressed by a crystalline grain size as described above, a density degree of the same crystalline grain size, or the like. The crystallization ratio may be a crystallization ratio of crystal components only, or a crystallization ratio of crystal components to amorphous components.

In the present embodiment, each of the first semiconductor film 5 and the second semiconductor films 6 is an amorphous silicon film (intrinsic amorphous silicon) in which impurity has not been doped purposely. For example, it is possible in the already-manufactured TFT that the first semiconductor film 5 and the pair of the second semiconductor films 6 are still amorphous silicon films and have different energy levels at lower ends of the respective conduction bands. It is also possible that one of the first semiconductor film 5 and the pair of the second semiconductor films 6 is an amorphous silicon film and the other is a crystalline silicon thin film including crystalline silicon, and the first semiconductor film 5 and the pair of the second semiconductor films 6 have different energy levels at lower ends of the respective conduction bands. Although an amorphous silicon film is generally composed of amorphous components only, the amorphous silicon film according to the present embodiment includes also crystalline components.

The pair of the contact layers 7 are formed on the pair of the second semiconductor films 6, respectively. The contact layers 7 face each other with a predetermined distance. One of the contact layers 7 in the pair is provided on one of the second semiconductor films 6 in the pair. The other one of the contact layers 7 in the pair is provided on the other one of the second semiconductor films 6 in the pair. According to the present embodiment, a planar view shape of the pair of the contact layers 7 is the same as a planar view shape of the pair of the second semiconductor films 6.

Each of the contact layers 7 in the pair is composed of an amorphous semiconductor film including high-concentration impurity. For example, each of the contact layers 7 may be an n-type semiconductor film generated by doping phosphorus (P) as impurity to amorphous silicon. Each of the contact layers 7 is an n$^+$ layer including high-concentration impurity of $1\times10^{19}$ (atm/cm$^3$) or more. The thickness of each of the contact layers 7 may be, for example, 5 nm to 100 nm.

Note that, the pair of the contract layers 7 may be two layers: a lower low-concentration electric field limiting layer (n$^-$ layer) and an upper high-concentration contact layer (n$^+$ layer). The low-concentration electric field limiting layer is doped with phosphorus of approximately $1\times10^{17}$ (atm/cm$^3$). The above-described two layers may be continuously formed by a Chemical Vapor Deposition (CVD) apparatus.

The pair of the source electrode 8S and the drain electrode 8D are provided on the pair of the contact layers 7, respectively. The source electrode 8S and the drain electrode 8D face each other with a predetermined distance. The source electrode 8S is provided above one of the second semiconductor films 6 in the pair and on one of the contact layers 7 in the pair. The drain electrode 8D is provided above the other one of the second semiconductor films 6 in the pair and on the other one of the contact layers 7 in the pair. According to the present embodiment, the source electrode 8S and the drain electrode 8D are provided to cover a set of the contact layers 7, the second semiconductor films 6, the first semiconductor film 5, and the crystalline silicon thin film 4. The source electrode 8S and the drain electrode 8D are provided not only on the top surfaces of the contact layers 7, but also on the side surfaces of the contact layers 7, the side surfaces of the second semiconductor films 6, the side surfaces of the first semiconductor film 5, and the side surfaces of the crystalline silicon thin film 4.

In the present embodiment, each of the source electrode 8S and the drain electrode 8D may have a single-layer structure or multilayer structure that is made of a conductive material, an alloy including the material, or the like, and is made of, for example, aluminum (Al), molybdenum (Mo), tungsten (W), copper (Cu), titanium (Ti), and chromium (Cr). In the present embodiment, each of the source electrode 8S and the drain electrode 8D may have a three-layer structure of MoW/Al/MoW. The thickness of each of the source electrode 8S and the drain electrode 8D may be, for example, approximately 100 nm to 500 nm.

Next, the description is given for effects of the thin-film transistor device 10 according to the present embodiment and how to achieve the present embodiment.

Figure 2:
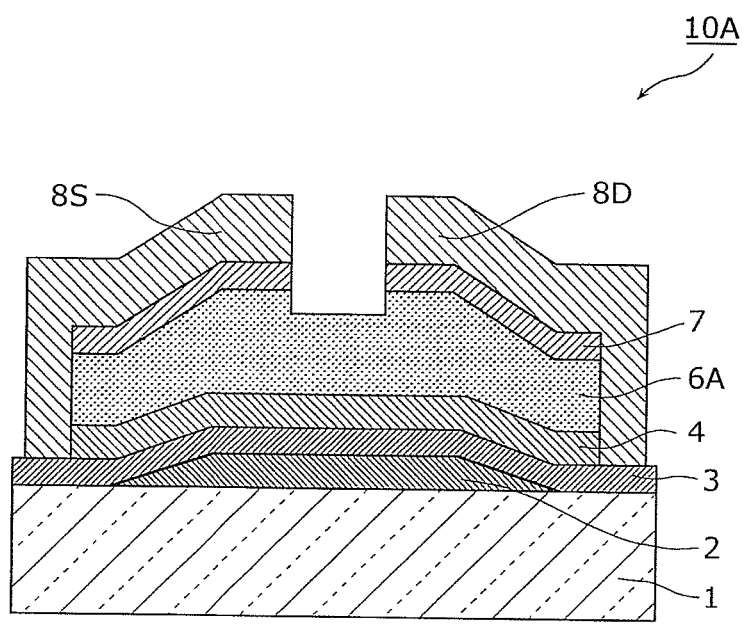
FIG. 2 is a cross-sectional view schematically illustrating a structure of a thin-film transistor device according to a comparative example.

In a channel-etching thin-film transistor device, in order to ensure compatibility between turn-On characteristics and turn-Off characteristics, it may be considered that a semiconductor film composed of an amorphous silicon film is provided on a channel layer (crystalline silicon thin film) as illustrated in FIG. 2. FIG. 2 is a cross-sectional view schematically illustrating a structure of a thin-film transistor device according to a comparative example. The same reference numerals in FIG. 1 are assigned to the identical structural elements in FIG. 2.

As illustrated in FIG. 2, in the thin-film transistor device 10A according to the comparative example, a semiconductor film 6A composed of an amorphous silicon film is provided between a crystalline silicon thin film composed of a polycrystalline silicon thin film and the pair of the contact layers 7. This structure can suppress Of-current (leak current when turning Off) while On-current is ensured, thereby improving turn-Off characteristics.

It has been found, however, that the thin-film transistor device 10A according to the comparative example illustrated in FIG. 2 causes kink phenomenon in the drain current/drain-to-source voltage (Id–Vds) characteristics.

Therefore, the inventors of the present disclosure have examined the reasons of the kink phenomenon occurrence. As a result, it has been found that the amorphous silicon film introduced to suppress a leak current causes the kink phenomenon. The following describes the examination results with reference to FIGS. 3A, 3B, 4A, 4B, and 5.

Figure 3A:
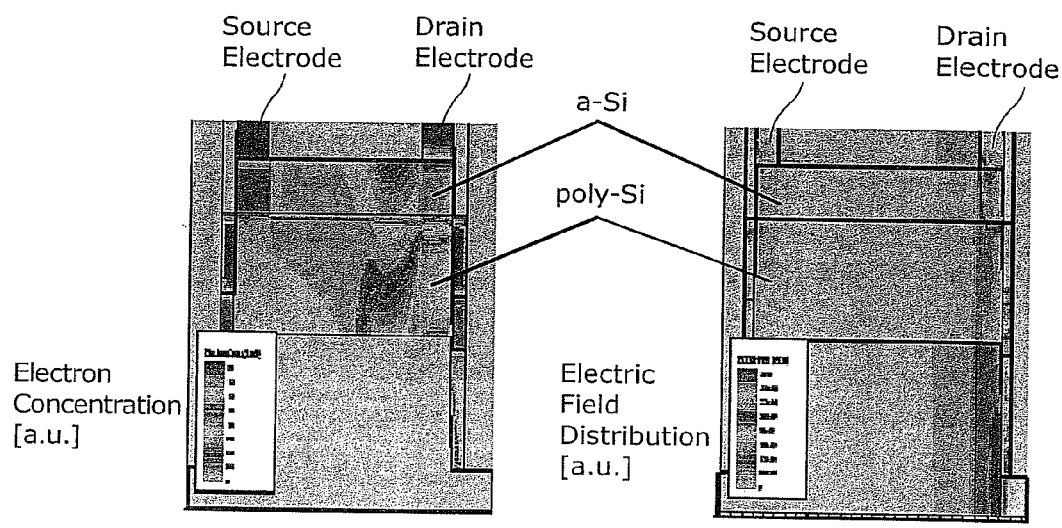
FIG. 3A is a diagram illustrating electron concentration and electric field distribution of a semiconductor layer in a thin-film transistor device in which polycrystalline silicon thin film and an amorphous silicon film (electron affinity=3.7 eV) are used as semiconductor layers.
Figure 3B:
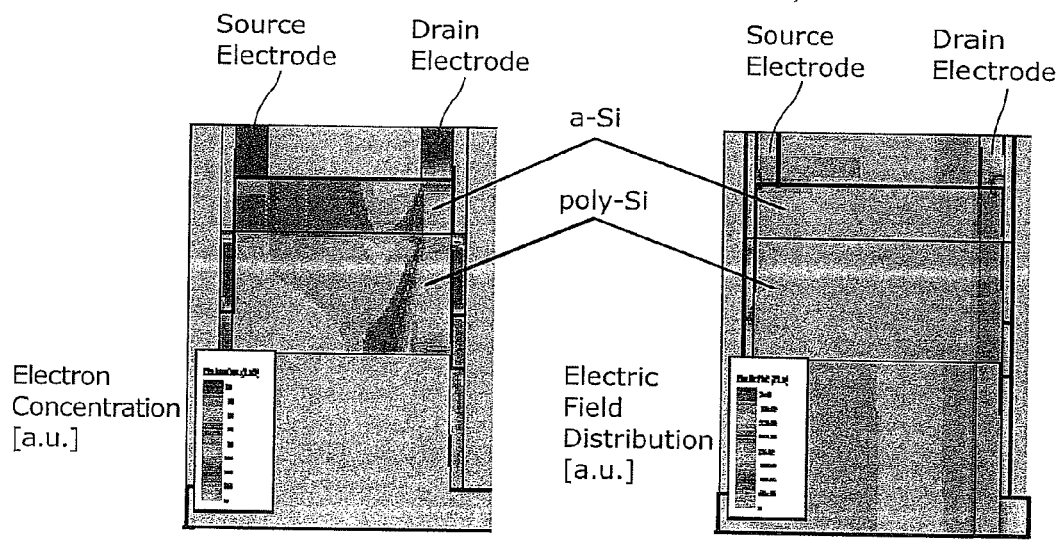
FIG. 3B is a diagram illustrating electron concentration and electric field distribution of a semiconductor layer in a thin-film transistor device in which polycrystalline silicon thin film and an amorphous silicon film (electron affinity=4.0 eV) are used as semiconductor layers.
Figure 4A:
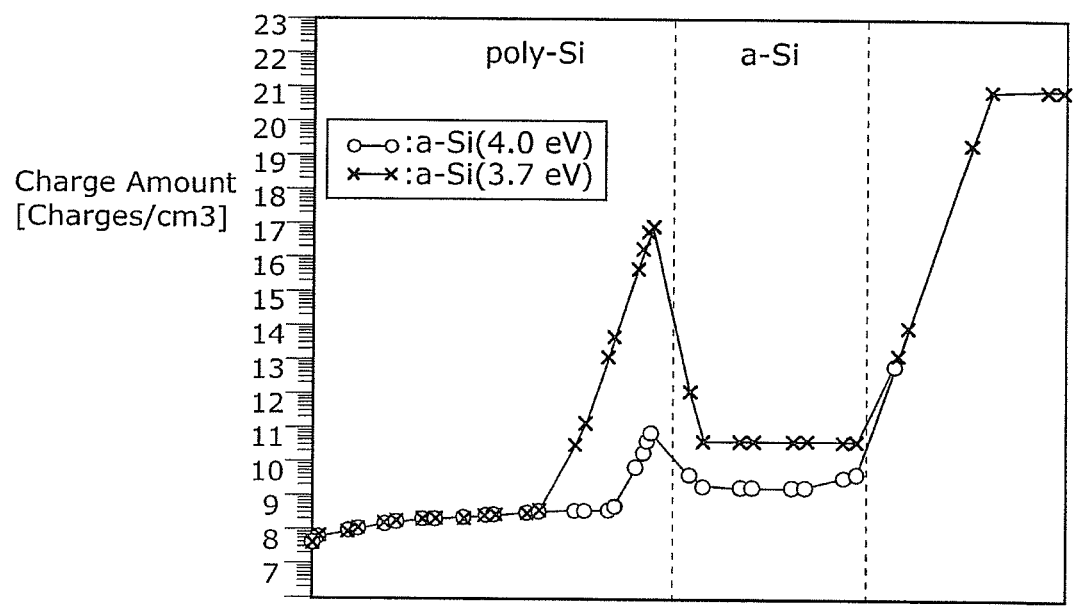
FIG. 4A is a graph plotting a charge amount of the semiconductor layer in the thin-film transistor device corresponding to FIGS. 3A and 3B.
Figure 4B:
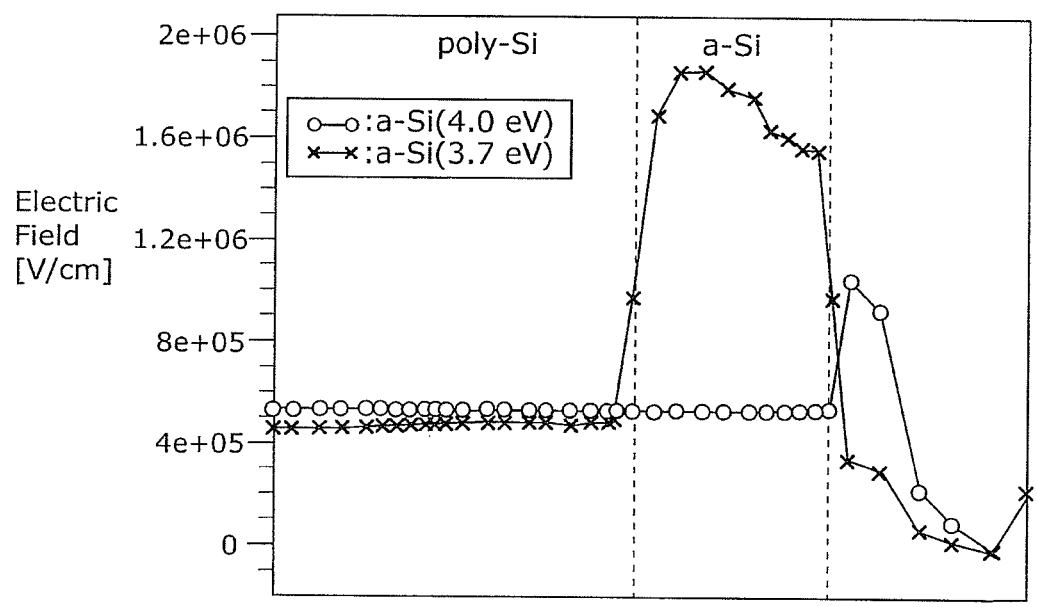
FIG. 4B is a graph plotting an electric filed of the semiconductor layer in the thin-film transistor device corresponding to FIGS. 3A and 3B.
Figure 5:
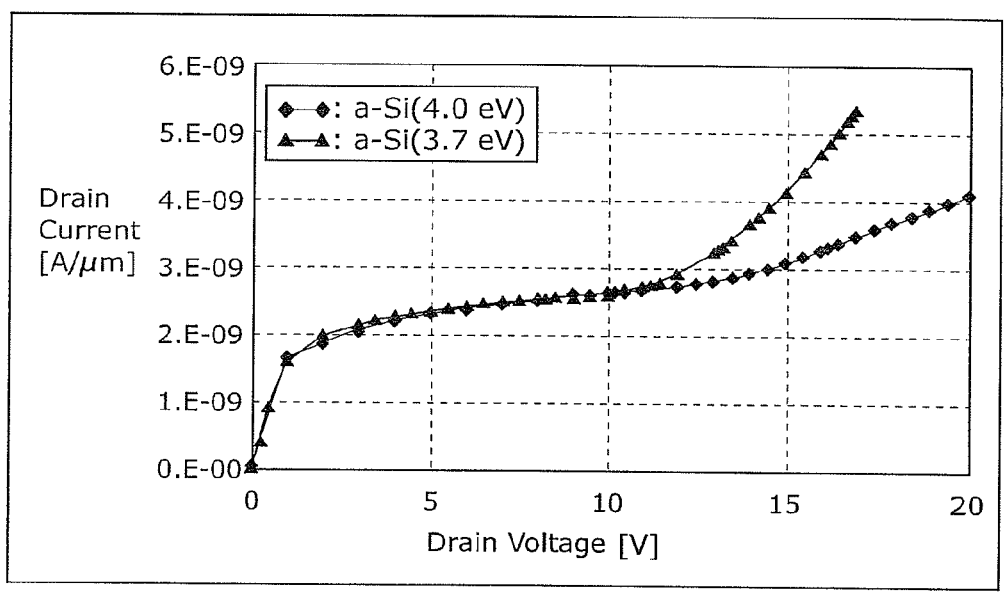
FIG. 5 is a graph plotting a relationship between a drain current and a drain-to-source voltage of the thin-film transistor device corresponding to FIGS. 3A and 3B.

Here, each of FIGS. 3A and 3B illustrates an electron concentration and electric field distribution of a semiconductor layer in a thin-film transistor device including, as the semiconductor layer, a polycrystalline silicon thin film (Poly-Si) and an amorphous silicon film (a-Si). FIG. 4A plots an amount of charges in the semiconductor layer in the thin-film transistor device corresponding to FIGS. 3A and 3B. FIG. 4B plots an electric field of the semiconductor layer in the thin-film transistor device corresponding to FIGS. 3A and 3B. FIG. 5 is a graph plotting a relationship between a drain current and a source-to-drain voltage at the thin-film transistor device corresponding to FIGS. 3A and 3B.

As illustrated in FIGS. 3A and 3B, in the thin-film transistor device having a two-layer structure of the polycrystalline silicon thin film and the amorphous silicon film, in the case where the amorphous silicon film has electron affinity of 3.7 eV (FIG. 3A), an electron density at a lower portion of the drain electrode is higher and an electric filed is therefore concentrated, in comparison to the case where the amorphous silicon film has an electron affinity of 4.0 eV (FIG. 3B). Note that the polycrystalline silicon thin film has an electron affinity of 4.12 eV.

As illustrated in FIG. 4A, in the case where the amorphous silicon film has the electron affinity of 3.7 eV (FIG. 3A), more electric charges are accumulated at the interface between the polycrystalline silicon thin film and the amorphous silicon film in comparison to the case where the amorphous silicon film has the electron affinity of 4.0 eV (FIG. 3B).

Furthermore, as illustrated in FIG. 4B, in the case where the amorphous silicon film has the electron affinity of 3.7 eV (FIG. 3A), the amorphous silicon film has an electric field that is several times as stronger as an electric field in the case where the amorphous silicon film has the electron affinity of 4.0 eV (FIG. 3B).

Then, as illustrated in FIG. 5, kink phenomenon occurs in the case where the amorphous silicon film has the electron affinity of 3.7 eV (FIG. 3A), in particular, in the case of high Vds. On the other hand, in the case where the amorphous silicon film has the electron affinity of 4.0 eV (FIG. 3B), kink phenomenon is suppressed in comparison to the case where the amorphous silicon film has the electron affinity of 3.7 eV (FIG. 3A).

As described above, it has been found that the electron affinity of the amorphous silicon film varies kink phenomenon when the semiconductor layer in the thin-film transistor device has a multi-layer structure of the polycrystalline silicon thin film and the amorphous silicon film. In particular, if the electron affinity of the amorphous silicon film is low, in other words, if the electron affinity of the amorphous silicon film is different from the electron affinity of the polycrystalline silicon thin film, kink phenomenon occurs even at a low drain-to-source voltage (Vds).

According to the above-described examination results, it has been found that kink phenomenon can be suppressed by adjusting the electron affinity of the amorphous silicon film. It has also been found that kink phenomenon can be suppressed by approximating the electron affinity of the amorphous silicon film to the electron affinity of the polycrystalline silicon thin film. Since electron affinity is, as described previously, a difference between a vacuum level and an energy level $E_c$ at a lower end of a conduction band, it is possible to suppress kink phenomenon by adjusting an energy level at a lower end of a conduction band of the amorphous silicon film.

On the other hand, as described earlier, the amorphous silicon film provided between the polycrystalline silicon thin film and the contact layers has a function of suppressing occurrence of a leak current. Therefore, when the electron affinity of the amorphous silicon film or the energy level at the lower end of the conduction band of the amorphous silicon film is merely adjusted to suppress kink phenomenon, the leak current suppression effects of the amorphous silicon film are reduced. As a result, opposite effects would occur, deteriorating the TFT characteristics.

In order to address this, the inventors of the present disclosure have conceived as illustrated in FIG. 1 that the crystalline silicon thin film 4, the first semiconductor film 5, and the pair of the second semiconductor films 6 are included as a semiconductor layer positioned between the source electrode 8S and the drain electrode 8D (the contact layers 7) and the gate insulating film 3, and respective energy levels at lower ends of conduction bands of the crystalline silicon thin film 4 and the first semiconductor film 5 are set to satisfy a relationship of $E_{CP} < E_{C1}$. As a result, kink phenomenon can be suppressed.

Figure 6:
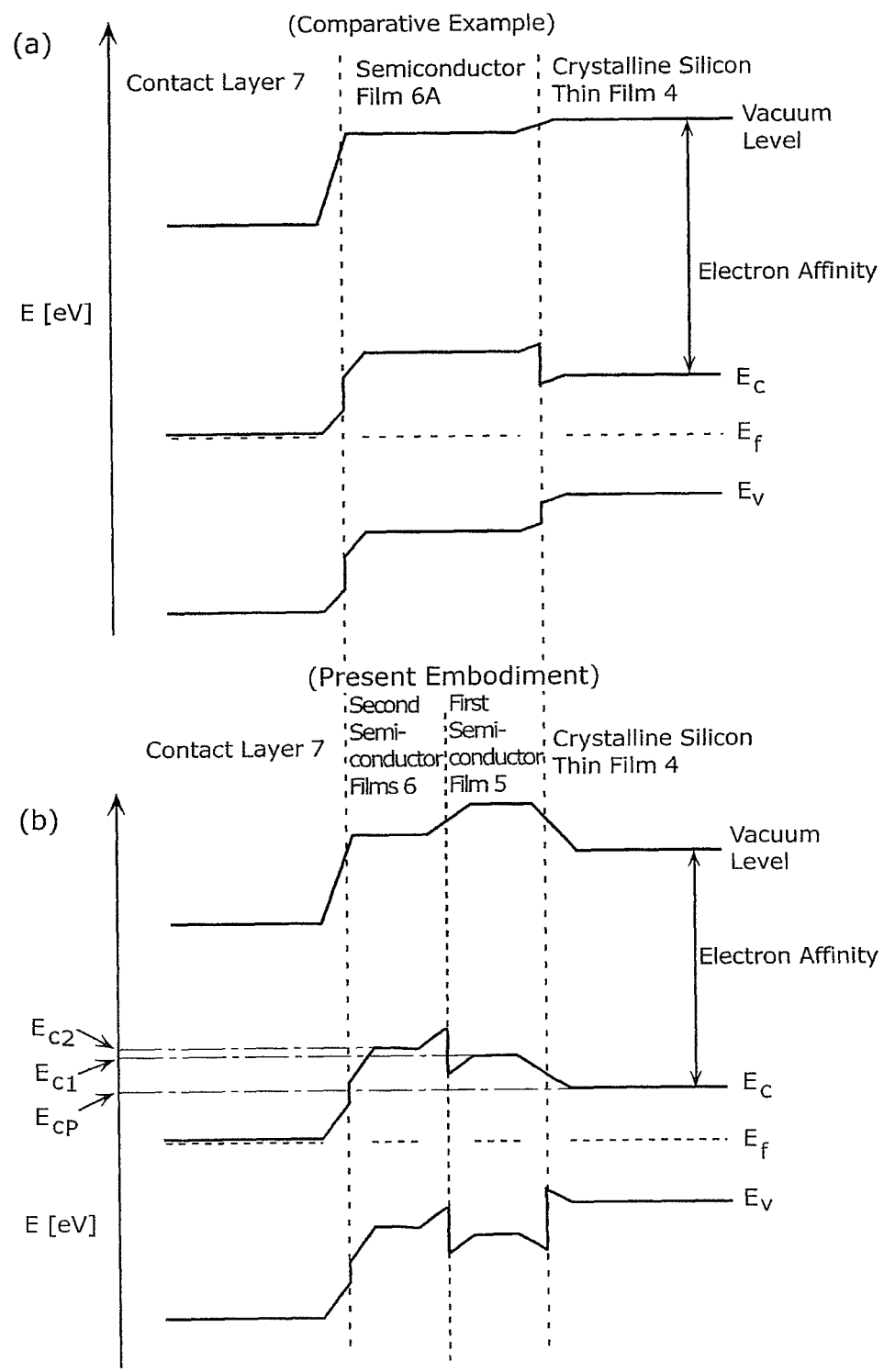
FIG. 6 illustrates (a) a diagram of an energy band of a semiconductor film of the thin-film transistor device (present embodiment) according to the exemplary embodiment illustrated in FIG. 1 and (b) a diagram of an energy band of a semiconductor film of the TFT (comparative example) according to the comparative example illustrated in FIG. 2.

Next, the effects of kink phenomenon suppression are described in comparison to the thin-film transistor device 10A according to the comparative example with reference to FIGS. 6, 7A, and 7B. FIG. 6 illustrates (a) a diagram of an energy band of the semiconductor film in the thin-film transistor device (present embodiment) according to the present embodiment illustrated in FIG. 1 and (b) a diagram of an energy band of the semiconductor film of the thin-film transistor device (comparative example) according to the comparative example illustrated in FIG. 2. In FIG. 6, $E_c$ represents an energy level at a lower end of a conduction band, $E_f$ represents a fermi level, and $E_v$ represents an energy level at an upper end of a valence band. FIG. 7A is a graph plotting a relationship of a drain current (Id) to a drain voltage (Vds) in the thin-film transistor device illustrated in FIG. 2 according to the comparative example. FIG. 7B is a graph plotting a relationship of a drain current (Id) to a drain voltage (Vds) in the thin-film transistor device illustrated in FIG. 1 according to the present embodiment. In FIG. 7A, the thickness of each of the second semiconductor films 6A is assumed to be 75 nm. In FIG. 7B, the thickness of the first semiconductor film 5 is assumed to be 35 nm, and the thickness of each of the second semiconductor film 6 is assumed to be 20 nm. Thickness of each of the other films is assumed to be the same between FIGS. 7A and 7B.

As illustrated in FIG. 6 (a), in the thin-film transistor device 10A according to the comparative example, a band gap of each of the semiconductor films 6A is greater than a band gap of the crystalline silicon thin film 4. The energy level $E_c$ at the lower end of the conduction band is higher in each of the semiconductor films 6A than in the crystalline silicon thin film 4. The electron affinity is greater in the crystalline silicon thin film 4 than in each of the semiconductor films 6A. Therefore, in the thin-film transistor device 10A according to the comparative example, at the junction between the crystalline silicon thin film 4 and each of the semiconductor films 6A, there is a great difference of the energy level $E_c$ at the lower end of the conduction band between the crystalline silicon thin film 4 and each of the semiconductor films 6A. A sharp discontinuous portion (spike) thereby appears at the junction. As a result, as described above, charges are accumulated at the junction between the crystalline silicon thin film 4 and each of the semiconductor films 6A to cause a strong electric field in each of the semiconductor films 6A, and as illustrated in FIG. 7, kink phenomenon occurs. In particular, as the gate voltage (Vgs) is higher, more kink phenomenon occurs at a lower drain voltage (Vds).

In contrast, as illustrated in FIG. 6 (b), in the thin-film transistor device 10 according to the present embodiment, the energy level $E_c$ at the lower end of the conduction band of the first semiconductor film 5 positioned between the crystalline silicon thin film 4 and each of the second semiconductor films 6 is set to be greater than the energy level $E_c$ at the lower end of the conduction band of the crystalline silicon thin film 4.

Therefore, the respective energy levels at the lower ends of the conduction bands of the crystalline silicon thin film 4 and the first semiconductor film 5 are continuous at the junction between the crystalline silicon thin film 4 and the first semiconductor film 5. From the first semiconductor film 5 to the crystalline silicon thin film 4, there is thereby no barrier (potential barrier) between the conduction band of the first semiconductor film 5 and the conduction band of the crystalline silicon thin film 4, so that the conduction bands are smoothly connected. As a result, in the thin-film transistor device 10 according to the present embodiment, no spike occurs at the junction between the crystalline silicon thin film 4 and the first semiconductor film 5. It is therefore possible to suppress the kink phenomenon occurrence as illustrated in FIG. 7B.

Furthermore, in the case of FIG. 7B, a total thickness of the first semiconductor film 5 and each of the second semiconductor films 6 is 55 nm. Since the total thickness is thinner than that in the case of FIG. 7A where the thickness of each of the semiconductor films 6 is 75 nm, electric field is stronger which easily causes kink phenomenon. However, as illustrated in FIG. 7B, the thin-film transistor device 10 according to the present embodiment can suppress occurrence of kink phenomenon. This means that the thin-film transistor device 10 according to the present embodiment can suppress occurrence of kink phenomenon even if a total thickness of the semiconductor films is thin.

As described above, in the thin-film transistor device 10 according to the present embodiment, the first semiconductor film 5 functions as a conduction band adjustment layer to adjust an energy level at a lower end of a conduction band between the crystalline silicon thin film 4 and each of the second semiconductor films 6. By desirably adjusting the energy level $E_{C1}$ at a lower end of a conduction band of the first semiconductor film 5, it is possible to suppress occurrence of kink phenomenon.

Furthermore, in the thin-film transistor device 10 according to the present embodiment, the semiconductor film above the crystalline silicon thin film 4 is a partly-crystallized amorphous silicon film, not the intrinsic amorphous silicon film in the comparative example. Therefore, in comparison to the comparative example illustrated in FIG. 2, it is possible to reduce On resistance to improve turn-On characteristics.

Moreover, the thin-film transistor device 10 according to the present embodiment, the second semiconductor films 6 each provided between the source electrode 8S or the drain electrode 8D (the contact layer 7) and the crystalline silicon thin film 4 is an amorphous silicon film having a relatively large band gap. As a result, it is possible to suppress occurrence of a leak current when turning Off, thereby improving turn-Off characteristics.

As described above, the thin-film transistor device 10 according to the present embodiment can improve turn-On characteristics and turn-Off characteristics and also suppress occurrence of kink phenomenon. As a result, a thin-film transistor having reliable TFT characteristics can be provided.

Note that, in the present embodiment, the energy level at the lower end of the conduction band of the semiconductor film such as the first semiconductor film 5 can be adjusted by changing an electron affinity or a band gap. In the present embodiment, the energy level $E_{C1}$ at the lower end of the conduction band of the first semiconductor film 5 is adjusted to cause the energy levels of the respective semiconductor films to satisfy the relationship of $E_{CP} < E_{C1}$.

For example, by causing the first semiconductor film 5 and the pair of the second semiconductor films 6, each of which is mainly made of silicon, to have different band gaps, it is possible to adjust the energy levels of the lower ends of the conduction bands of the first semiconductor film 5 and the pair of the second semiconductor films 6. In this case, it is desirable that the band gap of the first semiconductor film 5 is closer to the band gap of the crystalline silicon thin film 4 than the band gap of each of the second semiconductor films 6 is. With this structure, at the junction between the crystalline silicon thin film 4 and the first semiconductor film 5, the energy levels at the lower ends of the conduction bands are continuous, thereby suppressing occurrence of a spike at the junction.

The energy level $E_{C1}$ at the lower end of the conduction band of the first semiconductor film 5 can be adjusted, as described earlier, also by changing a crystallization ratio of the semiconductor film such as the first semiconductor film 5 made mainly of silicon. In the present embodiment, the crystallization ratio of the first semiconductor film 5 composed of an amorphous silicon film is set to be greater than the crystallization ratio of each of the second semiconductor films 6 composed of an amorphous silicon film. With this structure, at the junction between the crystalline silicon thin film 4 and the first semiconductor film 5, the energy levels at the lower ends of the conduction bands are continuous, thereby suppressing occurrence of a spike at the junction.

Note that it has been described in the present embodiment that an example method of adjusting the energy level at the lower end of the conduction band of the semiconductor film such as the first semiconductor film 5 is a method of changing an electron affinity, a crystallization ratio, or a band gap. However, the present embodiment is not limited to the above. For example, it is possible to adjust the energy level at the lower end of the conduction band of the semiconductor film such as the first semiconductor film 5, by causing impurity such as carbon (C) to be included in the first semiconductor film 5 or the like which is made mainly of silicon. By causing impurity such as carbon to be included, a band offset part occurs in the conduction band. As a result, it is possible to change the energy level at the lower end of the conduction band of each semiconductor film such as the first semiconductor film 5.

In the present embodiment, since a spike occurs at a conduction band due to electrons accumulated in the drain electrode side, the energy level at the lower end of the conduction band is adjusted to suppress the spike. However, it is also considered that a spike occurs at a valence band due to holes accumulated in the source electrode side. In this case, a spike at a valence band can be suppressed by adjusting the energy levels at upper ends of the valence bands of the semiconductor films which are the crystalline silicon thin film 4, the first semiconductor film 5, and the pair of the second semiconductor films 6.

In this case, by changing an electron affinity, a crystallization ratio, or a band gap of each of the semiconductor films which are the crystalline silicon thin film 4, the first semiconductor film 5, and the pair of the second semiconductor films 6 as described earlier, it is possible to adjust the energy levels at the upper ends of the valence bands of the respective semiconductor films. It is also possible to adjust the energy levels at the upper ends of the valence bands of the respective semiconductor films such as the first semiconductor film 5, by causing impurity such as germanium (Ge) to be included in each of the semiconductor films, such as the first semiconductor film 5, which are made mainly of silicon. By causing impurity such as germanium to be included, a band offset part occurs in the corresponding valence band. As a result, it is possible to change the energy level at the lower end of the conduction band of each semiconductor film such as the first semiconductor film 5.

Next, the method for manufacturing the thin-film transistor device 10 according to the present embodiment shall be described with reference to FIGS. 8A to 8J. FIGS. 8A to 8J are cross-sectional views schematically illustrating respective steps in the method for manufacturing the thin-film transistor device according to the present embodiment.

First, as illustrated in FIG. 8A, a glass substrate is prepared as the substrate 1. Prior to forming of the gate electrode 2, an undercoat layer composed of a silicon nitride film, a silicon oxide film, or a silicon oxynitride film may be formed on the substrate 1 by the plasma CVD or the like.

Figure 8B:
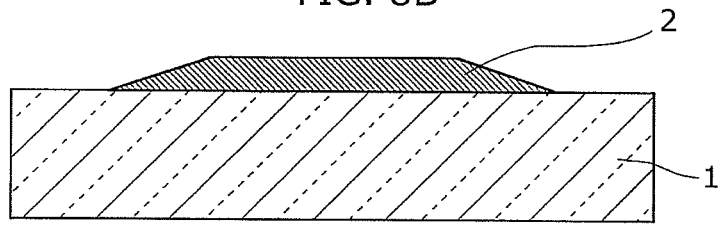
FIG. 8B is a cross-sectional view schematically illustrating a step of forming a gate electrode in the method for manufacturing the thin-film transistor device according to the exemplary embodiment.

Next, as illustrated in FIG. 8B, the gate electrode 2 in a predetermined shape is formed on/above the substrate 1. For example, the gate electrode 2 in the predetermined shape may be formed by forming a gate metal film made of molybdenum-tungsten (MoW) on the substrate 1 through sputtering, and by patterning the gate metal film using the photolithography and the wet etching. The wet etching on MoW may be performed using a chemical solution which is a mixture of trihydrogen phosphate ($H_3PO_4$), nitric acid ($HNO_3$), acetic acid ($CH_3COOH$) and water in a predetermined ratio, for example.

Figure 8C:
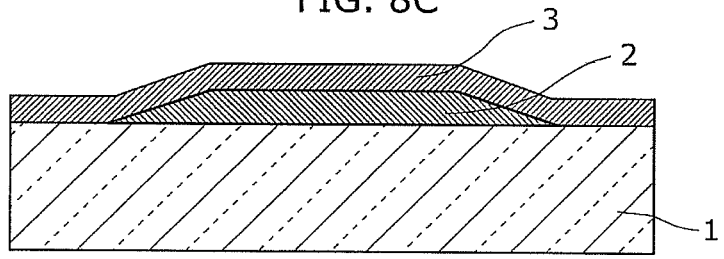
FIG. 8C is a cross-sectional view schematically illustrating a step of forming a gate insulating film in the method for manufacturing the thin-film transistor device according to the exemplary embodiment.

Next, as illustrated in FIG. 8C, the gate insulating film 3 is formed above the substrate 1 on which the gate electrode 2 is formed. For example, the gate insulating film 3 made of silicon oxide is formed by the plasma CVD or the like to cover the gate electrode 2. Silicon oxide is formed, for example, by introducing silane gas ($SiH_4$) and nitrous oxide gas ($N_2O$) in a predetermined ratio of concentration, for example.

Figure 8D:
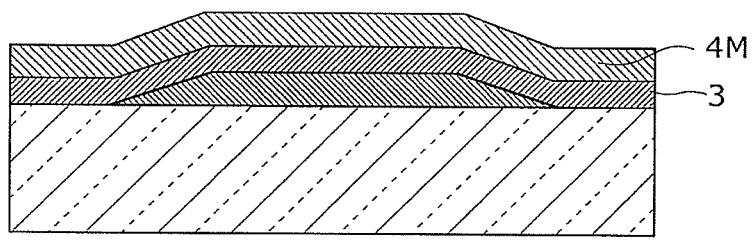
FIG. 8D is a cross-sectional view schematically illustrating a step of forming a crystalline silicon thin film in the method for manufacturing the thin-film transistor device according to the exemplary embodiment.

Next, as illustrated in FIG. 8D, the crystalline silicon thin film 4M having the channel region is formed on the gate insulating film 3. For example, first, an amorphous silicon thin film composed of amorphous silicon is formed by the plasma CVD or the like, and a dehydrogenation annealing is performed. After that, the amorphous silicon thin film is annealed for crystallization so as to form the crystalline silicon thin film 4M. The amorphous silicon film is formed by introducing silane gas ($SiH_4$) and hydrogen gas ($H_2$) in a predetermined ratio of concentration, for example.

Note that, in the present embodiment, the amorphous silicon thin film is crystallized by the laser annealing using the excimer laser. As the method for crystallization, the laser annealing using a pulse laser with a wavelength approximately 370 nm to 900 nm, the laser annealing using the continuous wave laser with a wavelength approximately 370 nm to 900 nm, or the annealing by the Rapid Thermal Processing (RTP) may be used. Furthermore, the crystalline silicon thin film 4M may be formed by a method such as direct growth by the CVD, instead of crystallizing the amorphous silicon thin film.

Subsequently, by performing hydrogen plasma treatment on the crystalline silicon thin film 4M, silicon atoms in the crystalline silicon thin film 4M are hydrotreated. The hydrogen plasma treatment is performed by generating hydrogen plasma from gas containing hydrogen gas such as $H_2$, $H_2$/argon (Ar), using a radio frequency (RF) power, and by irradiating the crystalline silicon thin film 4M with the hydrogen plasma. With the hydrogen plasma treatment, the dangling bond (defect) of silicon atoms are hydrogen terminated. As a result, the crystal defect density of the crystalline silicon thin film 4 is reduced, improving the crystallinity.

Figure 8E:
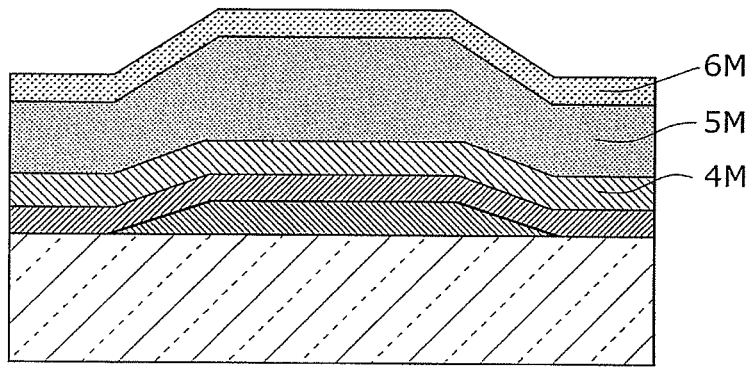
FIG. 8E is a cross-sectional view schematically illustrating a step of forming a first semiconductor film and a second semiconductor film in the method for manufacturing the thin-film transistor device according to the exemplary embodiment.

Next, as illustrated in FIG. 8E, a multi-layer film consisting of a plurality of semiconductor films which are the first semiconductor film 5M and the second semiconductor film 6M on the channel region of the crystalline silicon thin film 4M. In this step, the crystalline silicon thin film 4M and the first semiconductor film 5M are formed to satisfy $E_{CP} < E_{C1}$ relationship between the energy level at the lower end of the conduction band of the crystalline silicon thin film 4M and the energy level at the lower end of the conduction band of the first semiconductor film 5M.

In the present embodiment, the first semiconductor film 5M and the second semiconductor film 6M are continuously formed in the same vacuum apparatus. More specifically, the first semiconductor film 5M and the second semiconductor film 6M are formed without breaking vacuum. For example, if an amorphous silicon film is formed on the crystalline silicon thin film 4M under the predetermined film-forming conditions by using plasma CVD or the like after forming the crystalline silicon thin film 4M, it is possible to continuously form the first semiconductor film 5M and the second semiconductor film 6M. Regarding the film-forming conditions, for example, it is possible to set an RF power concentration to be greater or set a film-forming rate to be slower in comparison to the film-forming conditions for the amorphous silicon film in forming the crystalline silicon thin film 4M.

More specifically, the multi-layer film including the first semiconductor film 5M and the second semiconductor film 6M can be formed, by introducing silane gas ($SiH_4$) and hydrogen gas ($H_2$) in a predetermined ratio of concentration by using the parallel plate type RF plasma CVD apparatus, when a flow rate of silane gas is 5 sccm to 15 sccm, a flow rate of hydrogen gas is 40 sccm to 75 sccm, a pressure is 1 Torr to 3 Torr, RF power is 0.1 kw/cm$^{-2}$ to 0.4 kw/cm$^{-2}$, and a distance between electrode substrates is 200 mm to 600 mm. In the present embodiment, the film forming is performed at a flow rate of silane gas of 10 sccm, a flow rate of hydrogen gas of 60 sccm, a pressure of 0.5 Torr, RF power of 0.25 kw/cm$^{-2}$, and a distance between electrode substrates of 300 mm.

Under the above-described film-forming conditions, amorphous silicon films are formed from the surface of the crystalline silicon thin film 4. A amorphous silicon film formed on and close to the surface of the crystalline silicon thin film 4M takes over the crystallinity of the crystalline silicon thin film 4M and is thereby naturally crystallized. In progressing the film forming, as being father away from the crystalline silicon thin film 4M, the crystallization ratio in the film is decreased. A film formed after reaching the crystallization ratio of zero is the second semiconductor film 6M that is an amorphous silicon film having amorphous components only with the crystallization ratio of zero. In other words, crystallization is progressed for the amorphous silicon film formed on and close to the surface of the crystalline silicon thin film 4M serving as an under-layer. Therefore, the first semiconductor film 5M and the second semiconductor film 6M are formed so that the crystallization ratio of the lower layer (first semiconductor film 5M) is naturally greater than the crystallization ratio of the upper layer (second semiconductor film 6M).

It is also possible to form the first semiconductor film 5M and the second semiconductor film 6M having different crystallization ratios by switching the film-forming conditions to another on purpose during forming the amorphous silicon film. For example, by changing concentration ratios or flow rates of material gas such as silane gas ($SiH_4$) and hydrogen gas ($H_2$) or changing a pressure in the vacuum apparatus, it is possible to form the first semiconductor film 5M and the second semiconductor film 6M having different crystallization ratios.

As a result, the first semiconductor film 5M and the second semiconductor film 6M can be formed at the same time to satisfy the relationship of $E_{CP} < E_{C1}$. Note that in the present embodiment, since the first semiconductor film 5M and the second semiconductor film 6M are continuously formed, it is possible to consider that they are a single film consisting of two layers (the first and second semiconductor layers) having different crystallization ratios.

The above-described processing can form a semiconductor film including the first semiconductor film 5M and the second semiconductor film 6M having different electron affinity. In the present embodiment, it is possible to form the first semiconductor film 5M and the second semiconductor film 6M so that the electron affinity of the first semiconductor film 5M is greater than the electron affinity of the second semiconductor film 6M.

Furthermore, the above-described processing can form a semiconductor film including the first semiconductor film 5M and the second semiconductor film 6M having different band gaps. In the present embodiment, it is possible to form the first semiconductor film 5M and the second semiconductor film 6M so that the band gap of the first semiconductor film 5M is closer to the band gap of the crystalline silicon thin film 4M than the band gap of the second semiconductor film 6M is.

Figure 8F:
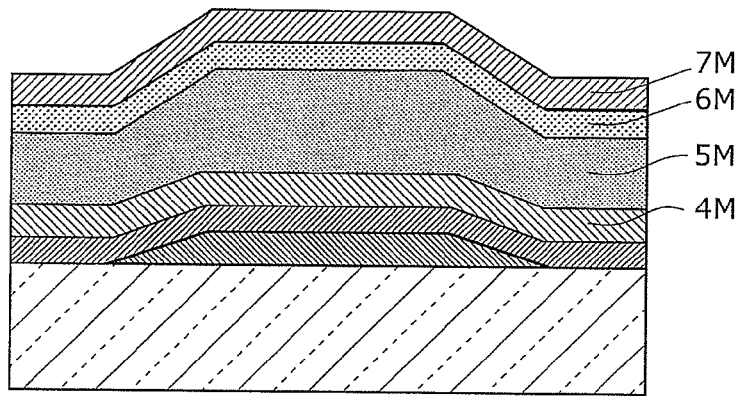
FIG. 8F is a cross-sectional view schematically illustrating a step of forming a contact-layer forming film in the method for manufacturing the thin-film transistor device according to the exemplary embodiment.

Next, as illustrated in FIG. 8F, a contact layer forming film 7M, which is to be the contact layers 7, is formed on the second semiconductor film 6M. For example, by plasma CVD, the contact layer forming film 7M made of amorphous silicon doped with impurity of quinquevalent element such as phosphorus is formed.

Note that, the contact layer forming film 7M may consist of two layers: a lower low-concentration electric field limiting layer and an upper high-concentration contact layer. The low-concentration electric field limiting layer can be formed by doing phosphorus of approximately $1 \times 10^{17}$ (atm/cm$^3$) to the contact layer forming film 8M. The above-described two layers may be continuously formed by a CVD apparatus, for example.

Figure 8G:
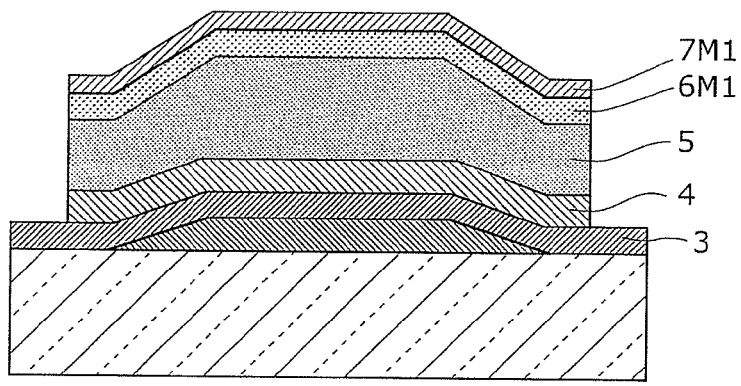
FIG. 8G is a cross-sectional view schematically illustrating a step of forming a multi-layer semiconductor film having an island shape in the method for manufacturing the thin-film transistor device according to the exemplary embodiment.

Next, as illustrated in FIG. 8G, by using photolithography and etching, a multi-layer structure including the crystalline silicon thin film 4M, the first semiconductor film 5M, the second semiconductor film 6M, and the contact layer forming film 7M is patterned to form a multi-layer structure in an island shape which includes the crystalline silicon thin film 4, the first semiconductor film 5, a second semiconductor film 6M1, and a contact layer forming film 7M1.

For example, a resist is coated on the contact layer forming film 7M, and by using lithographic exposure and development, parts of the resist are selectively left over the part corresponding to a predetermined channel region of the crystalline silicon thin film 4M and the first semiconductor film 5M. After that, by dry etching using the selectively left resists as masks, the crystalline silicon thin film 4M, the first semiconductor film 5M, the second semiconductor film 6M, and the contact layer forming film 7M are patterned to form the crystalline silicon thin film 4, the first semiconductor film 5, the second semiconductor film 6M1, and the contact layer forming film 7M1 in a predetermined shape.

Figure 8H:
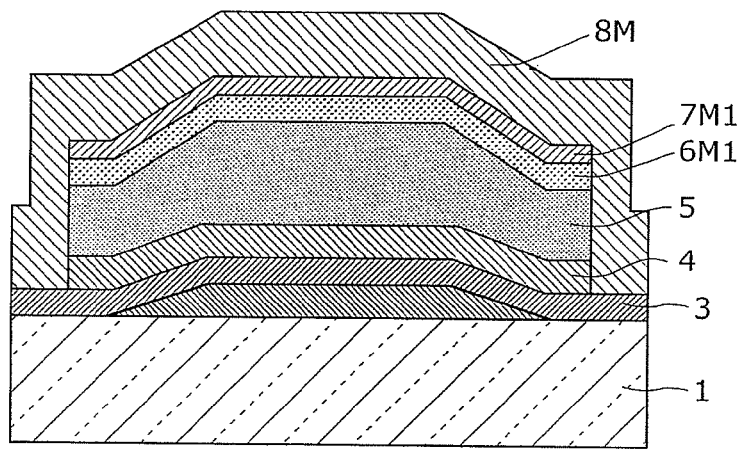
FIG. 8H is a cross-sectional view schematically illustrating a step of forming a source drain metal film in the method for manufacturing the thin-film transistor device according to the exemplary embodiment.

Next, as illustrated in FIG. 8H, a source drain metal film 8M made of a material to be the source electrode 8S and the drain electrode 8D is formed to cover the island-shaped multi-layer structure (the above-described structure having the predetermined shape). In the present embodiment, the source drain metal film 8M having a three-layer structure of MoW/Al/MoW is formed by sputtering.

Figure 8I:
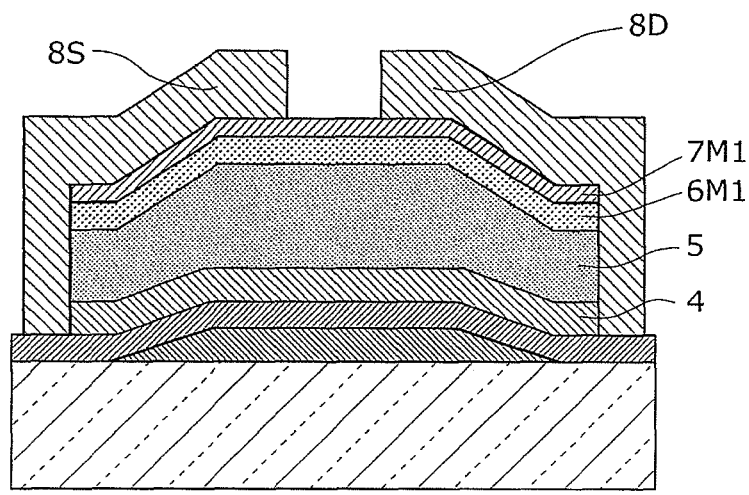
FIG. 8I is a cross-sectional view schematically illustrating a step of patterning a source electrode and a drain electrode in the method for manufacturing the thin-film transistor device according to the exemplary embodiment.

Next, as illustrated in FIG. 8I, by using photolithography and etching, the source drain metal film 8M is patterned to form the source electrode 8S and the drain electrode 8D in a predetermined shape.

For example, a resist is coated on the source drain metal film 8M, and by using lithographic exposure and development, parts of the resist are selectively left to form the predetermined shape on the parts to be the source electrode 8S and the drain electrode 8D. Next, by wet etching using the selectively left resists as masks, the source drain metal film 8M is patterned to form the source electrode 8S and the drain electrode 8D in the predetermined shape. Here, the contact layer forming film 7M1 over the channel region functions as an etching stopper layer.

Figure 8J:
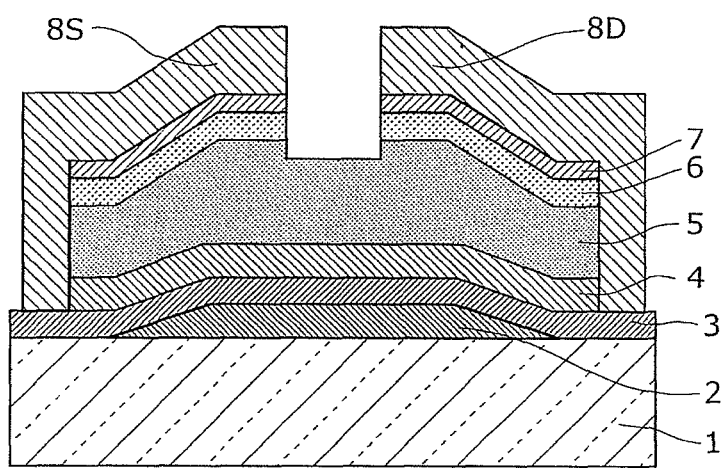
FIG. 8J is a cross-sectional view schematically illustrating a step of patterning on a pair of contact layers and a pair of second semiconductor films in the method for manufacturing the thin-film transistor device according to the exemplary embodiment.

Next, as illustrated in FIG. 8J, by dry etching using resists (not illustrated) on the source electrode 8S and the drain electrode 8D as masks, each of the exposed contact layer forming film 7M1 and the second semiconductor film 6M1 is etched to be separated to pieces. As a result, a pair of the contact layers 7 and a pair of the second semiconductor films 6 are formed. This etching removes a part of the upper portion of the first semiconductor film 5 under the region between the source electrode 8S and the drain electrode 8D. Therefore, the first semiconductor film 5 has a concave shape under the region between the source electrode 8S and the drain electrode 8D. As described above, by etching the part of the upper portion of the first semiconductor film 5, it is possible to form a channel layer (the crystalline silicon thin film 4 and the first semiconductor film 5) having a desired thickness.

After that, although it is not illustrated, the resists on the source electrode 8S and the drain electrode 8D are removed, and the source electrode 8S and the drain electrode 8D are cleaned. As described above, the thin-film transistor device 10 according to the present embodiment is manufactured.

Note that in the manufacturing method according to the present embodiment, the first semiconductor film 5M and the second semiconductor film 6M are continuously formed in the same vacuum apparatus, but it is also possible to form the first semiconductor film 5M and the second semiconductor film 6M separately in different steps under different film-forming conditions. It is therefore possible to suppress variations of elements in the first semiconductor film 5 and the pair of the second semiconductor films 6, thereby providing a thin-film transistor device suitable for a large panel.

Note also that, in the manufacturing method according to the present embodiment, the crystalline silicon thin film 4, the first semiconductor film 5, and the pair of the second semiconductor films 6 are patterned by being etched at the same time at the same step. However, it is also possible to perform the patterning of the crystalline silicon thin film 4 and the patterning of the first semiconductor film 5 and the pair of the second semiconductor films 6 at different steps. In this case, the first semiconductor film 5 and the pair of the second semiconductor films 6 may have the same shape as or different shapes from that of the crystalline silicon thin film 4.

In the manufacturing method according to the present embodiment, in the step for forming the first semiconductor film 5M and the pair of the second semiconductor films 6M, the film-forming conditions are adjusted to change electron affinity, crystallization ratios, or band gaps of the first semiconductor film 5 and the pair of the second semiconductor films 6 so as to adjust energy levels at the lower ends of the conduction bands. However, the present embodiment is not limited to the above. For example, in the step for forming the first semiconductor film 5 and the pair of the second semiconductor films 6, impurity such as carbon is doped into the first semiconductor film 5 made mainly of silicon so as to adjust the energy level at the lower end of the conduction band. It is also possible that, in order to adjust the energy level at the upper end of the valence band, in the step for forming the first semiconductor film 5 and the pair of the second semiconductor films 6, impurity such as germanium is doped into the first semiconductor film 5 made mainly of silicon. Here, in order to dope impurity such as carbon or germanium into the first semiconductor film 5, it is desirable to form the first semiconductor film 5 and the pair of the second semiconductor films 6 separately in different steps.

Next, an example of applying the thin-film transistor device 10 according to the present embodiment to a display device is described with reference to FIG. 9. In the present embodiment, the thin-film transistor device 10 is applied to an organic EL display device.

Figure 9:
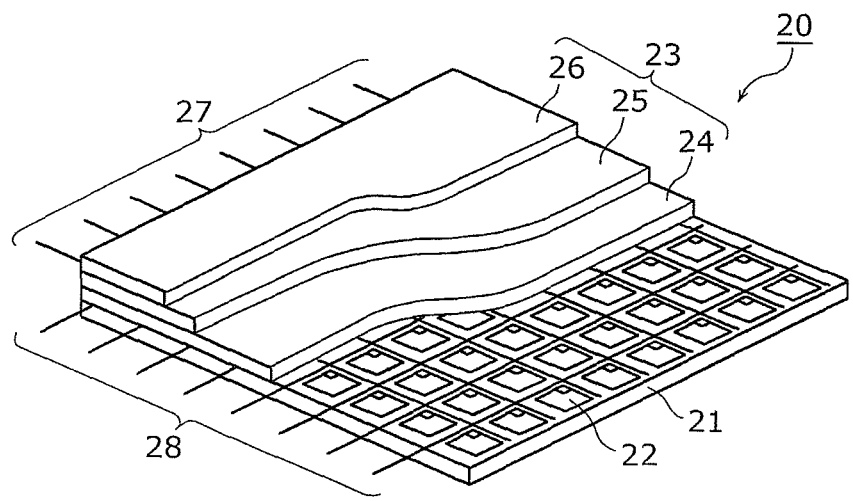
FIG. 9 is a partly-cutaway cross-sectional view of an organic EL display device according to the exemplary embodiment.

FIG. 9 is a partly-cutaway cross-sectional view of the organic EL display device according to the present embodiment. The above-described thin-film transistor device 10 can be used as switching transistors or driving transistors on an active matrix substrate for an organic EL display device.

As illustrated in FIG. 9, the organic EL display device 20 includes: an active matrix substrate (TFT array substrate) 21; pixels 22 arranged in a matrix on the active matrix substrate 21; organic EL elements 23 provided to the respective pixels 22; gate lines 27 along respective rows of the pixels 22; source lines 28 along respective columns of the pixels 22; and a power line 29 (not illustrated) in parallel to the source lines 28. The organic EL element 23 has an anode 24, an organic EL layer 25, and a cathode 26 (transparent electrode) which are sequentially stacked on the active matrix substrate 21. In practice, there are a plurality of the anodes 24 corresponding to the respective pixels 22. The organic EL layer 25 has a multi-layer structure including an electron transport layer, a luminescence layer, a hole transport layer, and the like.

Figure 10:
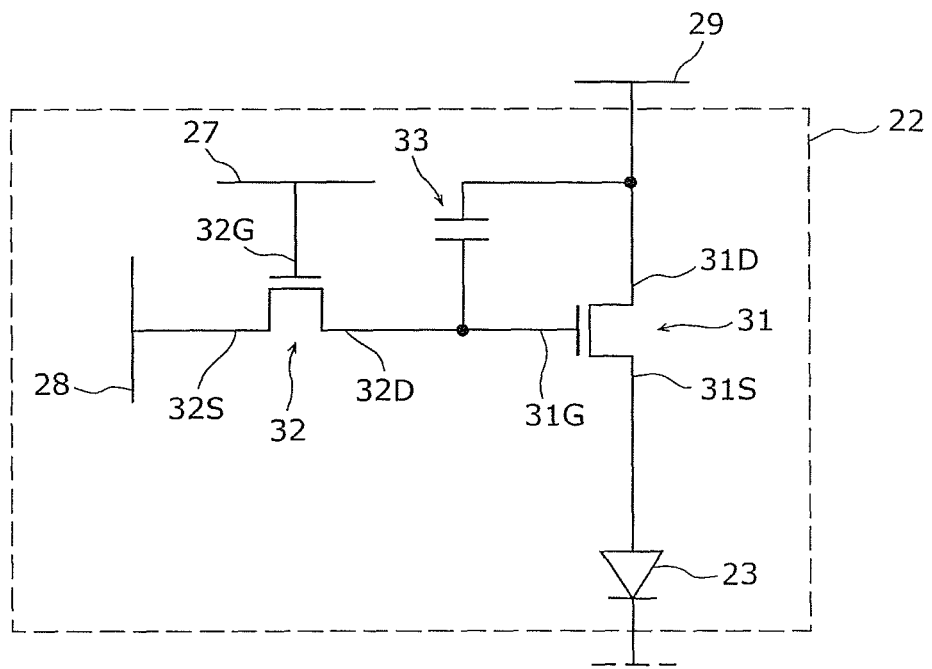
FIG. 10 is a diagram illustrating a circuit structure of a pixel having the thin-film transistor device according to the exemplary embodiment.

Next, a circuit structure of each of the pixels 22 in the above-described organic EL display device 20 is described with reference to FIG. 10. FIG. 10 is a diagram illustrating the circuit structure of the pixel including the thin-film transistor device according to the present embodiment.

As illustrated in FIG. 10, the pixels 22 are divided by the gate lines 27 and the source lines 28 which are perpendicular to each other, and each of the pixels 22 includes a driving transistor 31, a switching transistor 32, a capacitor 33, and an organic EL element 23. The driving transistor 31 drives the organic EL element 23. The switching transistor 32 selects the pixel 22.

In the driving transistor 31, a gate electrode 31G is connected to a drain electrode 32D of the switching transistor 32, a source electrode 31S is connected to an anode of the organic EL element 23 via a relay electrode (not illustrated), and a drain electrode 31D is connected to the power line 29.

In the switching transistor 32, a gate electrode 32G is connected to the scan line 27, a source electrode 32S is connected to a video signal line 28, and a drain electrode 32D is connected to the capacitor 33 and the gate line 31G of the driving transistor 31.

With this structure, when the gate signal is inputted to the gate line 27 to turn On the switching transistor 33, a video signal voltage supplied via the source line 28 is written into the capacitor 33. Then, the video signal voltage written to the capacitor 33 is held for one-frame duration. This hold video signal voltage causes analog changes in conductance of the driving transistor 31. Therefore, driving current corresponding to luminescence graduation flows from the anode of the organic EL element 23 to the cathode. Therefore, the organic EL element 23 emits light. As a result, it is possible to display predetermined image.

Note that, in the present embodiment, the organic EL display device including organic EL elements has been described, but the present embodiment can be applied also to other display devices, such as a liquid crystal display, which uses active matrix substrates. The display device having a such structure can be used as a flat panel display, and can be applied to electronic devices, such as a television set, a personal computer, and a mobile phone, which have various display panels.

Although the thin-film transistor device and the method for manufacturing the thin-film transistor device according to the present disclosure has been described based on the present embodiment, they are not limited to the above-described present embodiment.

For example, although it has been described in the present embodiment that the crystalline grain size of the crystalline silicon grains in the first semiconductor film 5 is gradually increased as being closer to the crystalline silicon thin film 4, it is also possible that a density degree of the crystalline grain size (crystalline silicon grain) included in the first semiconductor film 5 is gradually increased as being closer to the crystalline silicon thin film 4. In the above case, the crystallization ratio in a thickness direction of the first semiconductor film 5 is also gradually increased as being closer to the crystalline silicon thin film 4.

Figure 11:
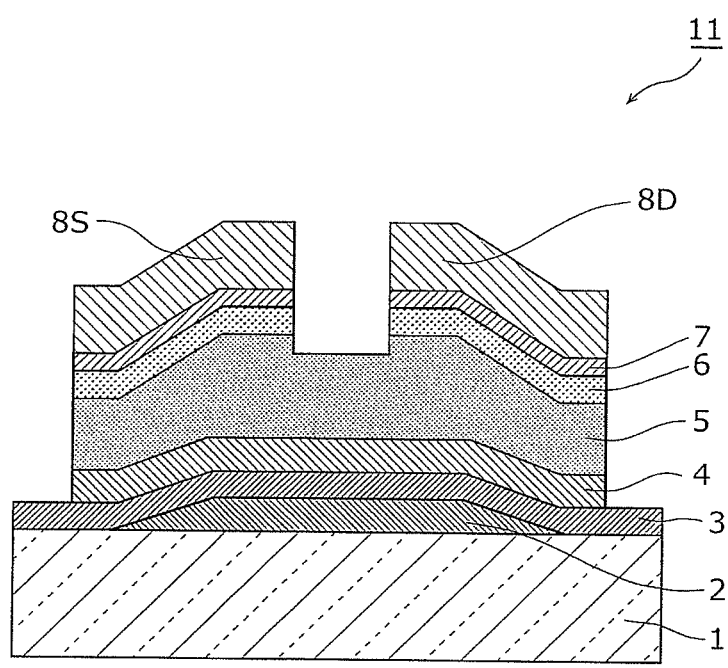
FIG. 11 is a cross-sectional view schematically illustrating a structure of a thin-film transistor device according to one exemplary embodiment.

Although it has also been described in the present embodiment that the source electrode 8S and the drain electrode 8D are formed by patterning the multi-layer film that includes the crystalline silicon thin film 4, the first semiconductor film 5, and the pair of the second semiconductor films 6, the present invention is not limited to the above. For example, it is also possible that the first semiconductor film 5M, the second semiconductor film 6M, and the contact layer forming film 7M are firstly formed (FIG. 8F), then the source drain metal film 8M is formed, then a multi-layer film including the first semiconductor film 5, the pair of the second semiconductor films 6, the contact layer forming film 7M, and the source drain metal film 8M is patterned to have a predetermined shape, and then the source drain metal film 8M is separated into the source electrode 8S and the drain electrode 8D. In this case, if a half tone mask or a gray tone mask is used as a patterning mask for the multi-layer film, it is possible to decrease the number of lithographic exposure processes by one. As a result, the processing can be simplified. This can provide the thin-film transistor device 11 having the structure as illustrated in FIG. 11.

Although it has been described in the present embodiment that an upper portion of the first semiconductor film 5 is etched, it is also possible that the upper portion of the first semiconductor film 5 is not etched and the etching stops at an upper portion of each of the second semiconductor films 6. In this case, a high-resistance film remains in the back channel of the thin-film transistor device, it is possible to reduce Off-current.

Those skilled in the art will be readily appreciated that various modifications and combinations of the structural elements and functions in the present embodiment are possible without materially departing from the novel teachings and advantages of the present disclosure. Accordingly, all such modifications and combinations are intended to be included within the scope of the present disclosure.

Each of the structural elements in each of the above-described embodiments may be configured in the form of an exclusive hardware product, or may be realized by executing a software program suitable for the structural element. Each of the structural elements may be realized by means of a program executing unit, such as a CPU and a processor, reading and executing the software program recorded on a recording medium such as a hard disk or a semiconductor memory. Here, the software program for realizing the thin-film transistor device according to each of the embodiments is a program described below.

The herein disclosed subject matter is to be considered descriptive and illustrative only, and the appended Claims are of a scope intended to cover and encompass not only the particular embodiment(s) disclosed, but also equivalent structures, methods, and/or uses.

INDUSTRIAL APPLICABILITY

The organic thin-film transistor according to the exemplary embodiment disclosed herein is widely applicable in display devices such as a television set, a personal computer, and a mobile phone, and the other various electric devices.

The invention claimed is:
1. A thin-film transistor device comprising:
a gate electrode above a substrate;
a gate insulating film above the gate electrode;
a crystalline silicon thin film above the gate insulating film;
a first semiconductor film above the crystalline silicon thin film;
a pair of second semiconductor films above the first semiconductor film;
a source electrode over one of the second semiconductor films; and
a drain electrode over an other one of the second semiconductor films,
wherein the first semiconductor film is provided on the crystalline silicon thin film,
$E_{CP} < E_{C1}$ where $E_{CP}$ denotes an energy level at a lower end of a conduction band of the crystalline silicon thin film and $E_{C1}$ denotes an energy level at a lower end of a conduction band of the first semiconductor film, and
the energy level $E_{CP}$ at the lower end of the conduction band of the crystalline silicon thin film and the energy level $E_{C1}$ at the lower end of the conduction band of the first semiconductor film are adjusted to suppress a spike at a junction between the crystalline silicon thin film and the first semiconductor film.
2. The thin-film transistor device according to claim 1, wherein electron affinity of the first semiconductor film is different from electron affinity of the second semiconductor films.
3. The thin-film transistor device according to claim 2, wherein the electron affinity of the first semiconductor film is greater than the electron affinity of the second semiconductor films.

4. The thin-film transistor device according to claim 1,
wherein the first semiconductor film and the pair of the second semiconductor films are semiconductor films made mainly of silicon and have different band gaps.

5. The thin-film transistor device according to claim 4, wherein the band gap of the first semiconductor film is closer to a band gap of the crystalline silicon thin film than the band gap of each of the second semiconductor films is.

6. The thin-film transistor device according to claim 1, wherein the first semiconductor film and the pair of the second semiconductor films are amorphous silicon films.

7. The thin-film transistor device according to claim 1, wherein the first semiconductor film and the pair of the second semiconductor films are semiconductor films made mainly of silicon and have different crystallization ratios.

8. The thin-film transistor device according to claim 7, wherein the crystallization ratio of the first semiconductor film is greater than the crystallization ratio of the pair of the second semiconductor films.

9. The thin-film transistor device according to claim 1, wherein, from the first semiconductor film to the crystalline silicon thin film, no barrier exists between the conduction band of the first semiconductor film and the conduction band of the crystalline silicon thin film.

10. The thin-film transistor device according to claim 1, wherein the first semiconductor film includes one of carbon and germanium.

11. The thin-film transistor device according to claim 1, wherein the first semiconductor film has a concave shape under a region between the source electrode and the drain electrode.

12. A method for manufacturing a thin-film transistor device, the method comprising:
preparing a substrate;
forming a gate electrode above the substrate;
forming a gate insulating film above the gate electrode;
forming a crystalline silicon thin film above the gate insulating film;
forming a multi-layer film above the crystalline silicon thin film, the multi-layer film including a first semiconductor film, a second semiconductor film, and a contact layer;
patterning the crystalline silicon thin film, the first semiconductor film, the second semiconductor film, and the contact layer to have a predetermined shape; and
forming a source electrode and a drain electrode above the second semiconductor film,
wherein in the forming of the multi-layer film,
the first semiconductor film is provided on the crystalline silicon thin film, and
$E_{CP} < E_{C1}$ where $E_{CP}$ denotes an energy level at a lower end of a conduction band of the crystalline silicon thin film and $E_{C1}$ denotes an energy level at a lower end of a conduction band of the first semiconductor film, and
in the forming of the multi-layer film, the first semiconductor film and the second semiconductor film are formed by setting the energy level $E_{CP}$ at the lower end of the conduction band of the crystalline silicon thin film and the energy level $E_{C1}$ at the lower end of the conduction band of the first semiconductor film to suppress a spike at a junction between the crystalline silicon thin film and the first semiconductor film.

13. The method according to claim 12, wherein, in the forming of the multi-layer film, the first semiconductor film and the second semiconductor film are formed by setting electron affinity of the first semiconductor film to be different from electron affinity of the second semiconductor film.

14. The method according to claim 13, wherein, in the forming of the multi-layer film, the first semiconductor film and the second semiconductor film are formed by setting the electron affinity of the first semiconductor film to be greater than the electron affinity of the second semiconductor film.

15. The method according to claim 12, wherein the first semiconductor film and the second semiconductor film are semiconductor films made mainly of silicon, and
in the forming of the multi-layer film, the first semiconductor film and the second semiconductor film are formed to have different band gaps.

16. The method according to claim 15, wherein, in the forming of the multi-layer film, the first semiconductor film and the second semiconductor film are formed by setting the band gap of the first semiconductor film to be closer to a band gap of the crystalline silicon thin film than the band gap of the second semiconductor film is.

17. The method according to claim 12, wherein, in the forming of the multi-layer film, the first semiconductor film and the second semiconductor film are amorphous silicon films.

18. The method according to claim 12, wherein the first semiconductor film and the second semiconductor film are semiconductor films made mainly of silicon, and
in the forming of the multi-layer film, the first semiconductor film and the second semiconductor film are formed to have different crystallization ratios.

19. The method according to claim 18, wherein, in the forming of the multi-layer film, the first semiconductor film and the second semiconductor film are formed by setting the crystallization ratio of the first semiconductor film to be greater than the crystallization ratio of the second semiconductor film.

20. The method according to claim 12, wherein, in the forming of the multi-layer film, the first semiconductor film includes one of carbon and germanium.

21. The method according to claim 12, wherein, in the forming of the multi-layer film, the first semiconductor film and the second semiconductor film are formed continuously in a same vacuum apparatus.

22. The method according to claim 12, further comprising removing a part of the contact layer and a part of an upper portion of the second semiconductor layer which are positioned between the source electrode and the drain electrode, after the forming of the source electrode and the drain electrode.

23. A thin-film transistor device comprising:
a gate electrode above a substrate;
a gate insulating film above the gate electrode;
a crystalline silicon thin film above the gate insulating film;
a first semiconductor film above the crystalline silicon thin film;
a pair of second semiconductor films above the first semiconductor film;
a source electrode over one of the second semiconductor films; and
a drain electrode over an other one of the second semiconductor films, wherein $E_{CP} < E_{C1}$ where $E_{CP}$ denotes an energy level at a lower end of a conduction band of the crystalline silicon thin film and $E_{C1}$ denotes an energy level at a lower end of a conduction band of the first semiconductor film, the first semiconductor film and the second semiconductor films are semiconductor films made mainly of silicon, and a crystallization ratio of the first semiconductor film is greater than a crystallization ratio of the second semiconductor films.

* * * * *

UNITED STATES PATENT AND TRADEMARK OFFICE
CERTIFICATE OF CORRECTION

Page 1 of 1

PATENT NO.         : 8,841,673 B2
APPLICATION NO.    : 13/742481
DATED              : September 23, 2014
INVENTOR(S)        : Arinobu Kanegae et al.

It is certified that error appears in the above-identified patent and that said Letters Patent is hereby corrected as shown below:

Title Page, (71) Applicant, of the printed patent, "(71) Applicant: Panasonic Corporation, Osaka (JP)" should read -- (71) Applicants: Panasonic Corporation, Osaka (JP); Panasonic Liquid Crystal Display Co., Ltd., Hyogo (JP) --.

Signed and Sealed this
Fourteenth Day of April, 2015

Michelle K. Lee
*Director of the United States Patent and Trademark Office*